United States Patent
Maejima

(10) Patent No.: US 7,167,046 B2
(45) Date of Patent: Jan. 23, 2007

(54) CLASS-D AMPLIFIER

(75) Inventor: Toshio Maejima, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/998,134

(22) Filed: Nov. 24, 2004

(65) Prior Publication Data

US 2005/0156665 A1   Jul. 21, 2005

(30) Foreign Application Priority Data

| Nov. 26, 2003 | (JP) | ............ P2003-395285 |
| Jun. 23, 2004 | (JP) | ............ P2004-184995 |
| Oct. 12, 2004 | (JP) | ............ P2004-297579 |

(51) Int. Cl.
*H03F 21/00*   (2006.01)

(52) U.S. Cl. .................. 330/207 A; 330/251

(58) Field of Classification Search ............. 330/10, 330/207 A, 251

See application file for complete search history.

(56) References Cited

U.S. PATENT DOCUMENTS

| 5,617,058 | A   | 4/1997 | Adrian et al. | |
| 6,346,852 | B1* | 2/2002 | Masini et al. | ....... 330/207 A |
| 6,614,297 | B1* | 9/2003 | Score et al. | ........... 330/207 A |
| 6,707,337 | B1* | 3/2004 | Noro | .................... 330/207 A |
| 6,794,932 | B1* | 9/2004 | Butler | .................. 330/207 A |

FOREIGN PATENT DOCUMENTS

| JP | 56-27001 | 3/1981 |
| JP | 07-163153 | 6/1995 |
| JP | 2000-500625 | 1/2000 |

OTHER PUBLICATIONS

Chang Soo Kil, "Notification of Submission of Opinions," Patent Office (Japan), p. all, (May 24, 2006).

* cited by examiner

*Primary Examiner*—Khanh Van Nguyen
(74) *Attorney, Agent, or Firm*—Pillsbury Winthrop Shaw Pittman LLP

(57) ABSTRACT

A class-D amplifier includes: an operational amplifier and capacitors, which constitute an integrator for integrating a difference between a plus-sided input signal and a minus-sided input signal which constitute analog input signals; delay circuits for delaying a phase of a triangular wave by a desirable very small angle; resistors, which constitute a synthesizing circuit for synthesizing an output of the integrator, the triangular wave, and outputs of the delay circuits with each other; comparators for comparing outputs of the synthesizing circuit with each other; AND circuits which constitute a buffer for inputting outputs of the comparators; and resistors feeding back an output of the buffer to an input side of the integrator.

10 Claims, 16 Drawing Sheets

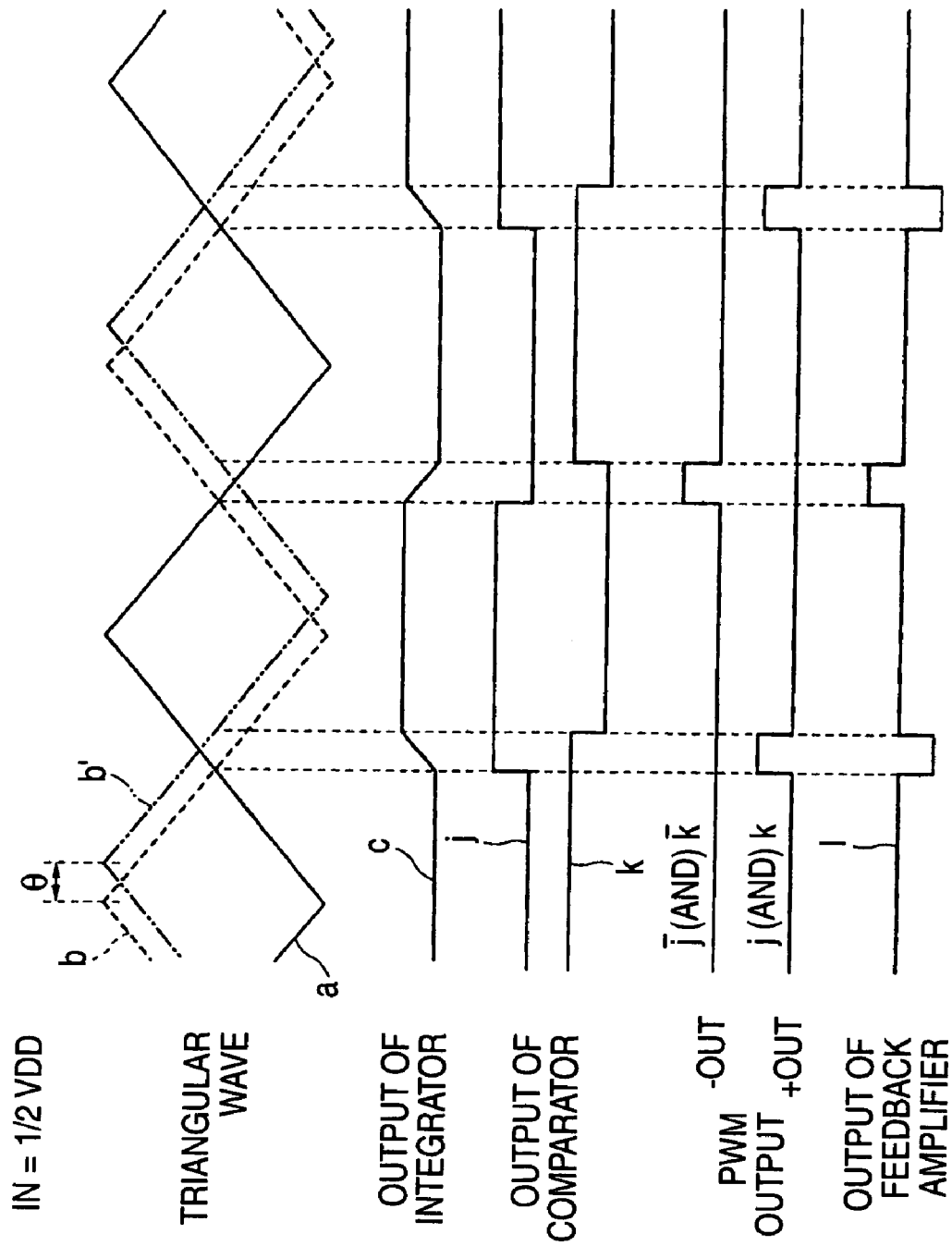

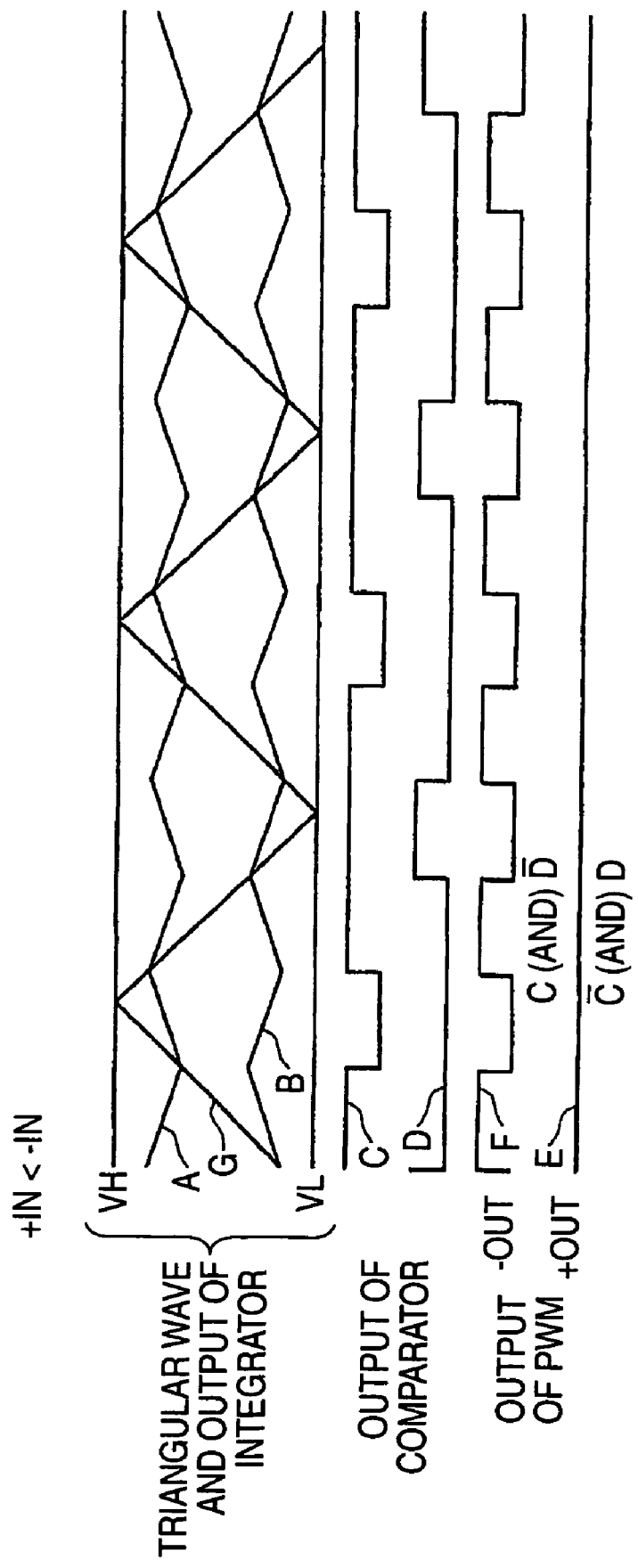

CLASS-D AMPLIFIER

BACKGROUND OF THE INVENTION

The present invention is related to a class-D amplifier.

Class-D amplifiers perform power amplification by pulse-width-modulating (PWM) input signals, and are utilized so as to perform power amplifications of audio signals. As conventional class-D amplifiers, there is such a class-D amplifier which is arranged by an integrator for integrating an analog input signal, a comparator for comparing an output signal of the integrator with a predetermined triangular wave, and a buffer (pulse amplifier) for amplifying an output signal of the comparator to output a pulse signal. In this conventional class-D amplifier, the pulse signal output from the buffer is fed back to the input side of the integrator. Then, the output signal of the buffer is filtered by a low-pass filter constructed of a coil and a capacitor so as to obtain an analog signal which drives a load such as a speaker.

As conventional pulse width modulating amplifiers, there is such a PWM amplifier which is arranged by a comparator for comparing an analog input signal with a triangular wave, an amplifier for amplifying an output of the comparator, and a transformer arranged between the amplifier and a load (refer to, for example, Japanese Patent Publication No. Sho-56-27001).

Further, as conventional digital amplifying circuits using digital signal processing circuits, there is such a digital amplifying circuit equipped with a noise shaper, a converter, a logic circuit, a switch, and a filter (refer to, for instance, Japanese Patent Disclosure No. 2000-500625) The noise shaper frequency-shapes a quantizing noise of a digital input signal. The converter converts a PCM (Pulse Code Modulation) signal corresponding to the output of the noise shaper into a PWM (Pulse Width Modulation) signal. The logic circuit compensates a linearity of the output signal of the converter. The switch is controlled by an output of the logic circuit. The input side of the filter is connected to a power supply by the switch.

However, in the above-explained conventional class-D amplifier, the buffer is constituted by two buffers, namely the plus-sided buffer and the minus-sided buffer. Even when an input signal is not present, these two buffers output the signals having the opposite polarities, the duty ratio of which is 50%. As a result, in the conventional class-D amplifier, even in such a case that the input signal is not present, the current may flow through the low-pass filter, which cause the large loss.

In Japanese Patent Publication No. Sho-56-27001, the technical idea for turning OFF the output amplifying element during no input signal is described in order to avoid the power loss when the input signal is not present. However, the conventional pulse width modulating amplifier described in the above-explained patent publication 1 owns such a problem that the transformer is required so as to convert the impedance and to cut off the DC voltage, which may conduct the large-scaled apparatus and the increase in cost thereof. Furthermore, the conventional pulse width modulating amplifier described in Japanese Patent Publication No. Sho-56-27001 has another problem that since the comparator compares the simple triangular wave with the input signal, the distortion of the output signal is large.

On the other hand, the digital amplifying circuit described in Japanese Patent Disclosure No. 2000-500625 uses the output statuses of either the three values or the four values (switching statuses), and amplifies the digital input signal, while such a digital circuit as the logic circuit is employed so as to improve the linearity. As a consequence, the digital amplifying circuit described in Japanese Patent Disclosure No. 2000-500625 owns a problem that since this digital amplifying circuit cannot be arranged by employing the analog circuit, the analog input signal cannot be amplified while maintaining the better linearity. In other words, in this conventional digital amplifying circuit, when the small signal pulse is input, since the compensation pulse is added to this small signal pulse, the output switch distortion in the logic circuit is compensated. However, this circuit for compensating the output switch distortion is constituted by employing only such a digital circuit as the logic circuit, so that the conventional digital amplifying circuit cannot amplify the analog input signal under better linearity condition.

SUMMARY OF THE INVENTION

The present invention has been made to solve the above-described problems, and therefore, is to provide a class-D amplifier operable in low distortion and under small power loss.

Also, the present invention is to provide a class-D amplifier operable in low distortion and under small power loss, while a transformer is not employed.

Also, the present invention is to provide a class-D amplifier capable of reducing a DC voltage component in an output thereof to substantially zero volt.

To solve the above-described problems, class-D amplifiers of the present invention own the below-mentioned structures.

(1) A class-D amplifier comprising:

an integrator that integrates an analog input signal;

a first comparator for comparing an output of the integrator with a first triangular wave;

a second comparator that compares the output of the integrator with a second triangular wave, the second triangular wave being equal to a waveform obtained by shifting a phase of the first triangular wave by an angle of 180 degrees plus, or a very small minus angle;

a buffer that outputs a plus-sided output signal and a minus-sided output signal based on an output of the first comparator and an output of the second comparator; and a feed back circuit that feeds back a difference between the plus-sided output signal and the minus-sided output signal to an input side of the integrator.

(2) The class-D amplifier according to (1), wherein the buffer includes:

a first buffer that calculates a logical product of the output of the first comparator and the output of the second comparator to output a calculated result as the minus-sided output signal; and a second buffer that calculates a logical product of the output of the first comparator and the output of the second comparator to output a calculated result as the plus-sided output signal.

(3) The class-D amplifier according to (1), wherein the feedback circuit includes a differential amplifier for amplifying a difference between the plus-sided output signal and the minus-sided output signal.

(4) A class-D amplifier comprising:

an integrator that integrates a difference between a plus-sided input signal and a minus-sided input signal, which constitute an analog input signal;

a delay circuit that delays a phase of a triangular wave by a predetermined very small angle;

a synthesizing circuit that synthesizes an output of the integrator, the triangular wave, and an output of the delay circuit with each other so as to output a plurality of output signals;

a comparator that compares the plurality of output signals of the synthesizing circuit with each other;

a buffer that inputs an output of the comparator; and a feedback circuit that feeds back an output of the buffer to an input side of the integrator.

(5) The class-D amplifier according to (4), wherein the triangular wave is constituted by a first triangular wave and a second triangular wave corresponding to a waveform produced by shifting a phase of the first triangular wave by an angle of 180 degrees, the delay circuit includes a first delay circuit for delaying the phase of the first triangular wave by the predetermined very small angle, and a second delay circuit for delaying a phase of the third triangular wave by the predetermined very small angle, the synthesizing circuit synthesizes the minus-sided output of the integrator with the first triangular wave to produce a first synthesized wave, synthesizes the pulse-sided output of the integrator with the second triangular wave to produce a second synthesized wave, synthesizes the minus-sided output of the integrator with an output of the second delay circuit to produce a third synthesized wave, and synthesizes the plus-sided output of the integrator with an output of the first delay circuit to produce a fourth synthesized wave, the comparator includes a first comparator for comparing the first synthesized wave with the second synthesized wave, and a second comparator for comparing the third synthesized wave with the fourth synthesized wave, the buffer includes a first buffer for calculating a logical product of an output of the first comparator and an output of the second comparator, and a second buffer for calculating a logical product of the output of the first comparator and the output of the second comparator, and the feedback circuit includes a first feedback circuit for feeding back the output of the first buffer to the plus-sided input of the integrator, and a second feedback circuit for feeding back the output of the second buffer to the minus-sided input of the integrator.

(6) A class-D amplifier comprising:

an integrator that integrates a difference between a plus-sided input signal and a minus-sided input signal, which constitute an analog input signal;

a synthesizing circuit that synthesizes an output of the integrator with a triangular wave, and synthesizes the output of the integrator with a triangular wave having an opposite phase to that of the first-mentioned triangular wave so as to output a plurality of signals, wherein the opposite-phased triangular wave corresponds to a waveform whose phase is shifted by 180 degrees with respect to the phase of the first-mentioned triangular wave;

a comparator that compares output signals of the synthesizing circuit with each other;

a buffer that inputs there into an output of the comparator; and a feedback circuit that feeds back an output of the buffer to an input side of the integrator, wherein the synthesizing circuit includes a plurality of resistors having at least two sorts of resistance values, and is arranged so that a phase difference is produced between the plurality of signals corresponding to the output of the synthesizing circuit based upon the resistance values of the plural resistors and an input capacitance of the comparator.

(7) The class-D amplifier according to (6), wherein the synthesizing circuit includes: a first synthesizing portion for synthesizing a minus-sided output of the integrator with the triangular wave to produce a first synthesized wave; a second synthesizing portion for synthesizing a plus-sided output of the integrator with the opposite-phased triangular wave to produce a second synthesized wave; a third synthesizing portion for synthesizing the minus-sided output of the integrator with the opposite-phased triangular wave to produce a third synthesized wave; and a fourth synthesizing portion for synthesizing the plus-sided output of the integrator with the triangular wave to produce a fourth synthesized wave;

the first synthesizing portion includes a first resistor whose one terminal is connected to the minus-sided output of the integrator, and a second resistor in which the triangular wave is applied to one terminal thereof; and the other terminal of the first resistor is connected to the other terminal of the second resistor so as to constitute an output terminal thereof;

the second synthesizing portion includes a third resistor whose one terminal is connected to the plus-sided output of the integrator, and a fourth resistor in which the triangular wave is applied to one terminal thereof; and the other terminal of the third resistor is connected to the other terminal of the fourth resistor so as to constitute an output terminal thereof;

the third synthesizing portion includes a fifth resistor whose one terminal is connected to the minus-sided output of the integrator, and a sixth resistor in which the opposite-phased triangular wave is applied to one terminal thereof; and the other terminal of the fifth resistor is connected to the other terminal of the sixth resistor so as to constitute an output terminal thereof;

the fourth synthesizing portion includes a seventh resistor whose one terminal is connected to the plus-sided output of the integrator, and an eighth resistor in which the triangular wave is applied to one terminal thereof; and the other terminal of the seventh resistor is connected to the other terminal of the eighth resistor so as to constitute an output terminal thereof;

the comparator includes a first comparator having one input terminal to which the output terminal of the first synthesizing portion is connected, and the other input terminal to which the output terminal of the second synthesizing portion is connected; and a second comparator having one input terminal to which the output terminal of the third synthesizing portion is connected, and the other input terminal to which the output terminal of the fourth synthesizing portion is connected;

the buffer includes a first buffer for calculate a logical product of an output of the first comparator and an output of the second comparator, and a second buffer for calculating a logical product of the output of the first comparator and the output of the second comparator;

the feedback circuit includes a first feedback circuit for feeding back the output of the first buffer to the plus-sided input of the integrator, and a second feedback circuit for feeding back the output of the second buffer to the minus-sided input of the integrator; and a resistance value of any one of the first resistor, the second resistor, the third resistor, and the fourth resistor is different from a resistance value of any one of the fifth resistor, the sixth resistor, the seventh resistor, and the eighth resistor.

(8) The class-D amplifier according to (7) wherein the resistance value of each of the first resistor, the second resistor, the third resistor, and the fourth resistor is a resistance value obtained by multiplying a value other than 1 with respect to the resistance value of each of the fifth resistor, the sixth resistor, the seventh resistor, and the eighth resistor.

(9) A class-D amplifier comprising:
an integrator that integrates a difference between a plus-sided input signal and a minus-sided input signal, which constitute an analog input signal;
a triangular wave generating circuit that includes a current source and a capacitor;
a comparator that compares an output of the integrator with an output of the triangular wave generating circuit:
a buffer that inputs an output of the comparator; and
a feed back circuit that feeds back an output of the buffer to an input side of the integrator.

(10) The class-D amplifier according to (9), wherein
one end of the capacitor is connected to one of input terminals of the comparator, and
the current source switches a direction of output current so as to repeat charge and discharge of the capacitor.

(11) The class-D amplifier according to (10), wherein
one end of the current source is connected to the one end of the capacitor,
the current source flows current in a direction in which the capacitor is charged when an electric potential of the capacitor is lower than a first electric potential and flows current in a direction in which the capacitor is discharged when the electric potential of the capacitor is higher than a second electric potential, and
the second electric potential is higher than the first electric potential.

(12) The class-D amplifier according to (9), wherein
the comparator includes a first comparator for comparing a minus-sided output of the integrator with the output of the triangular wave generating circuit, and a second comparator for comparing a plus-sided output of the integrator with the output of the triangular wave generating circuit,
the buffer includes a first buffer for calculating a logical product of an inverted value of an output of the first comparator and an output of the second comparator, and a second buffer for calculating a logical product of the first comparator with an inverted value of the second comparator, and
the feedback circuit includes a first feedback circuit for feeding back an output of the first buffer to a minus-sided input of the integrator, and a second feedback circuit for feeding back an output of the second buffer to a plus-sided input of the integrator.

In accordance with the present invention, the class-D amplifier can be provided which is operable in low distortion and under small power loss.

Also, the present invention can provide the class-D amplifier operable in low distortion and under small power loss, while the transformer is not employed, and also, the DC voltage component in the output thereof can be reduced to substantially zero volt.

BRIEF DESCRIPTION OF THE DRAWINGS

FIG. 6 is a waveform diagram for indicating operations of the class-D amplifier shown in FIG. 5 in the case that zero volt is applied to the class-D amplifier.

FIG. 17 is a waveform diagram showing operations in the case that minus value is applied to the class-D amplifier.

DETAILED DESCRIPTION OF PREFERRED EMBODIMENTS

Referring now to drawings, various embodiment modes of the present invention will be described.

Embodiment 1

Figure 1:
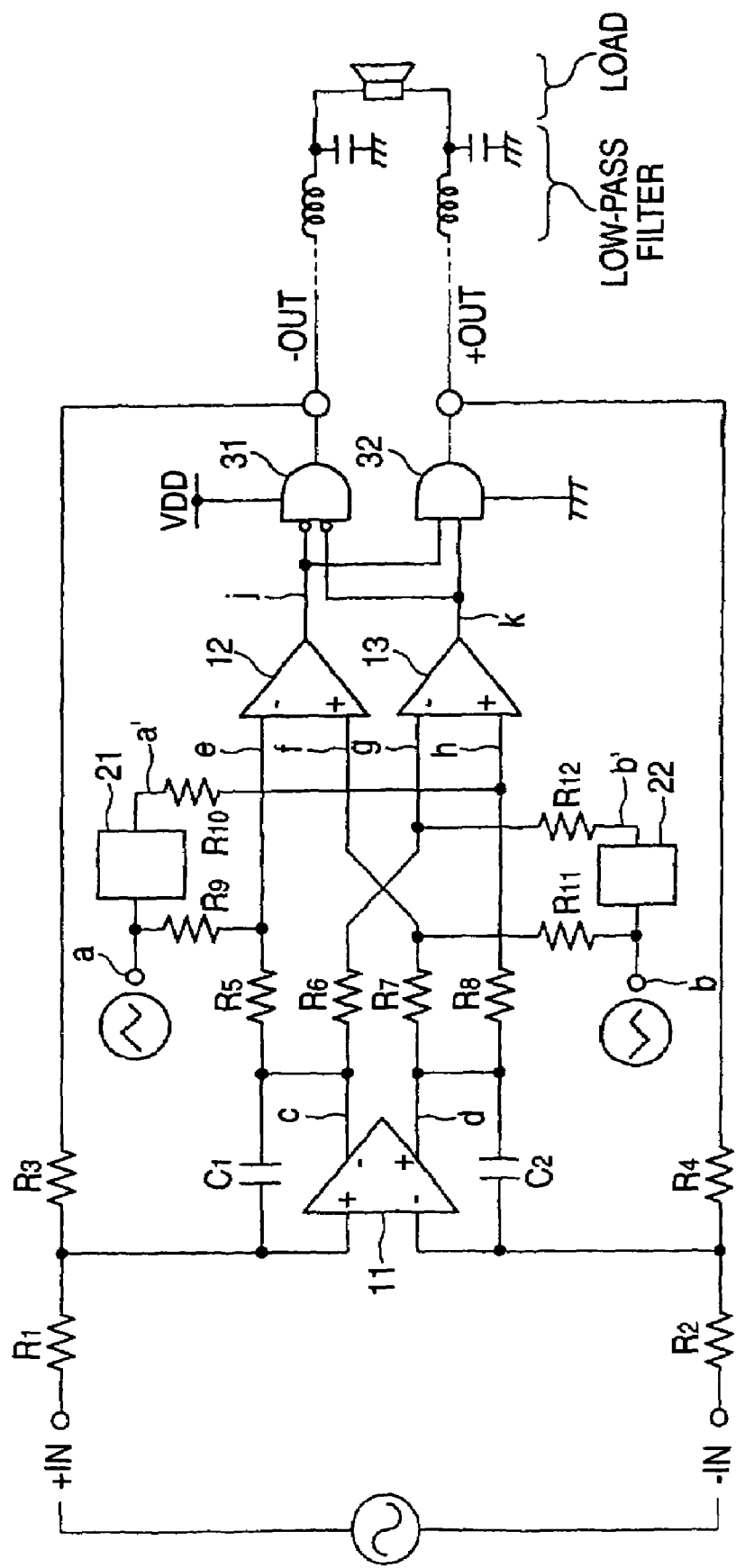
FIG. 1 is a circuit diagram for indicating a structural example of a class-D amplifier according to an embodiment mode 1 of the present invention.

FIG. 1 is a circuit diagram for indicating a structural example of a class-D amplifier according to an embodiment 1 of the present invention.

This class-D amplifier is arranged by resistors R1, R2, R3, R4, R5, R6, R7, R8, R9, R10, R11, and R12, capacitors C1 and C2, an operational amplifier 11, comparators 12 and 13, delay circuits 21 and 22, an AND circuit (low active) 31, and another AND circuit 32. Predetermined triangular wave signals "a" and "b" are applied to one terminals of the resistors R9 and R11 respectively in this drawing. Both the triangular wave signal "a" and the triangular wave signal "b" are such signals having the same waveforms, the phases of which are different from each other by 180 degrees.

One terminals of the resistors R1 and R2 constitute differential input terminals of analog input signals, respectively. Then, one terminal of the resistor R1 constitutes a plus-sided input terminal (+IN), and one terminal of the resistor R2 constitutes a minus-sided input terminal (−IN). The operational amplifier 11, and the capacitors C1 and C2 constitute an integrator. The analog input signals which have been input in the differential manner by the resistors R1 and R2 are integrated by this integrator, and the integrated signal is output to the resistors R5, R6, R7, and R8.

The resistors R5, R6, R7, R8, R9, R10, R11, and R12 constitute a synthesizing circuit which synthesizes either triangular wave signals "a'" or "b'" with the output signal of this integrator. The triangular wave signals "a'" and "b'" are produced by delaying the triangular wave signal "a" and the triangular wave signal "b" by a very small angle "θ" (namely, θ<<180 degrees). This synthesizing circuit produces four sorts of first to fourth synthesized waveforms "e", "f", "g", "h."

The first synthesized wave "e" is produced by synthesizing the minus-sided output signal of the operational amplifier 11 which constitutes the integrator with the triangular wave signal "a" (first triangular wave). The second synthesized wave "f" is produced by synthesizing the plus-sided output signal of the operational amplifier 11 which constitutes the integrator with the triangular wave signal "b" (second triangular wave). The third synthesized wave "g" is produced by synthesizing the minus-sided output signal of the operational amplifier 11 which constitutes the integrator with the triangular wave signal "b'." The fourth synthesized wave "h" is produced by synthesizing the plus-sided output signal of the operational amplifier 11 which constitutes the integrator with the triangular wave signal "a'" produced by delaying the triangular wave signal "a."

The comparator 12 (first comparator) compares the first synthesized wave "e" with the second synthesized wave "f" to output a comparison result. When the first synthesized wave "e" is larger than the second synthesized wave "f", the first comparator 12 outputs a predetermined "low" level signal (for example, zero level), whereas when the first synthesized wave "e" is smaller than the second synthesized wave "f", the first comparator 12 outputs a predetermined "high" level signal. The comparator 13 (second comparator) compares the third synthesized wave "g" with the second synthesized wave "h" to output a comparison result. When the third synthesized wave "g" is larger than the fourth synthesized wave "h", the second comparator 13 outputs a predetermined "low" level signal (for example, zero level), whereas when the third synthesized wave "g" is smaller than the fourth synthesized wave "h", the second comparator 13 outputs a predetermined "high" level signal. Both the comparators 12 and 13 may be alternatively realized by using operational amplifiers.

The AND circuit 31 corresponds to a buffer circuit having an AND gating function of a negative logic input. Then, the AND circuit 31 executes an AND calculation (low active) in which when both the output of the first comparator 12 and the output of the second comparator 13 are "low", this AND circuit 31 outputs a "high" level signal, and outputs this calculation result as a minus-sided output "−OUT" of this class-D amplifier. The resistor R3 constitutes a first feedback circuit. The first feedback circuit feeds back the output of the AND circuit 31 which functions as the buffer to the plus-sided input of the operational amplifier 11.

The AND circuit 32 corresponds to a buffer circuit having an AND calculating function, and executes the AND calculating operation between the output of the comparator 12 and the output of the comparator 13, and then, outputs the calculation result as a plus-sided output "+OUT" of this class-D amplifier. The resistor R4 constitutes a second feedback circuit. The second feedback circuit feeds back the output of the AND circuit 32 which functions as the buffer to the minus-sided input of the operational amplifier 11.

A load (speaker etc.) is connected via a low-pass filter between the plus-sided output "+OUT" of this class-D amplifier and the minus-sided output "−OUT" thereof. Since these circuit arrangements are employed, this class-D amplifier can amplify the analog input signals "+IN" and "−IN" in a low distortion without employing a transformer, and further, can drive the load, while power loss is reduced.

Figure 2:
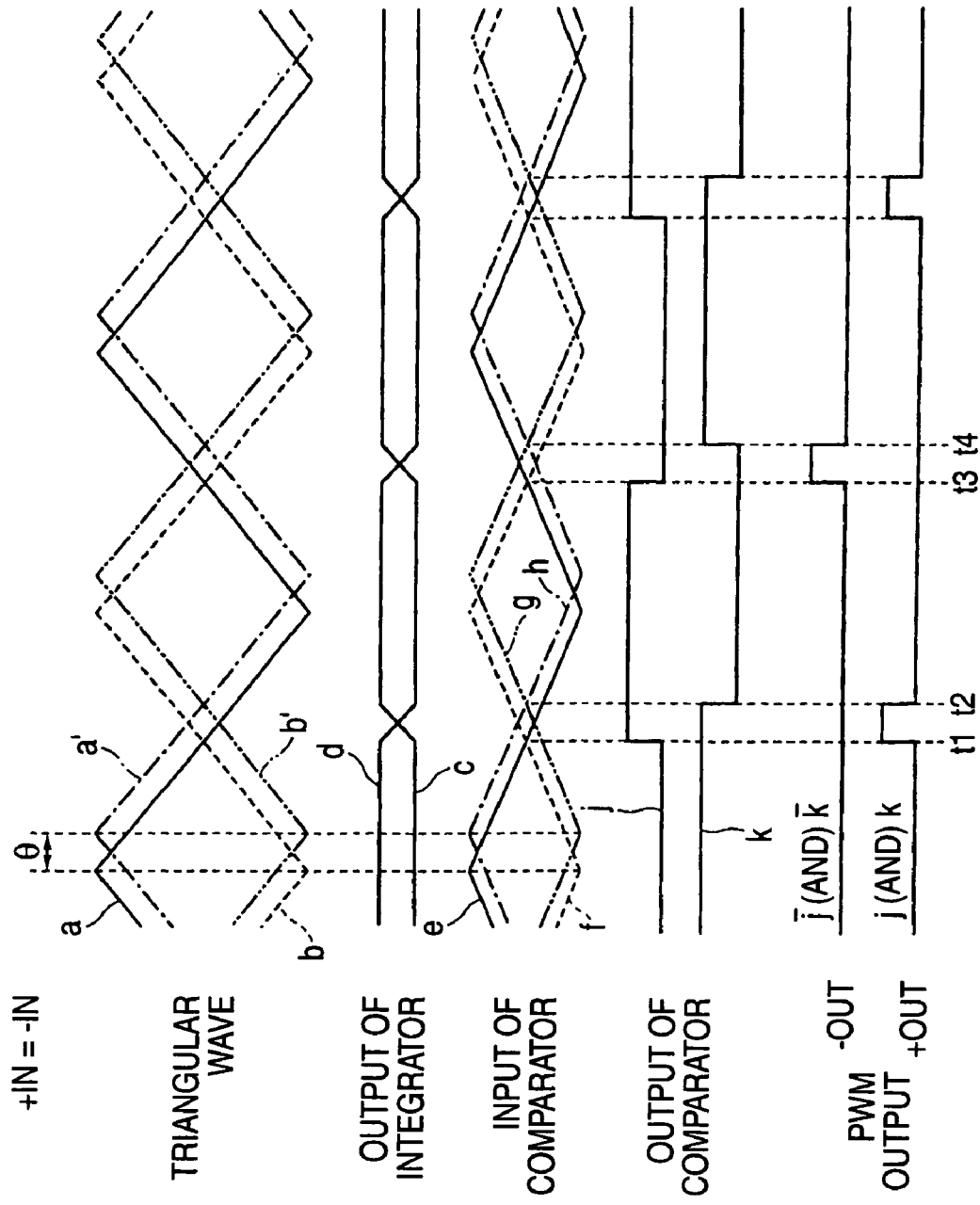
FIG. 2 is a waveform diagram for indicating operations of the class-D amplifier shown in FIG. 1 in the case that zero volt is applied to the class-D amplifier.
Figure 3:
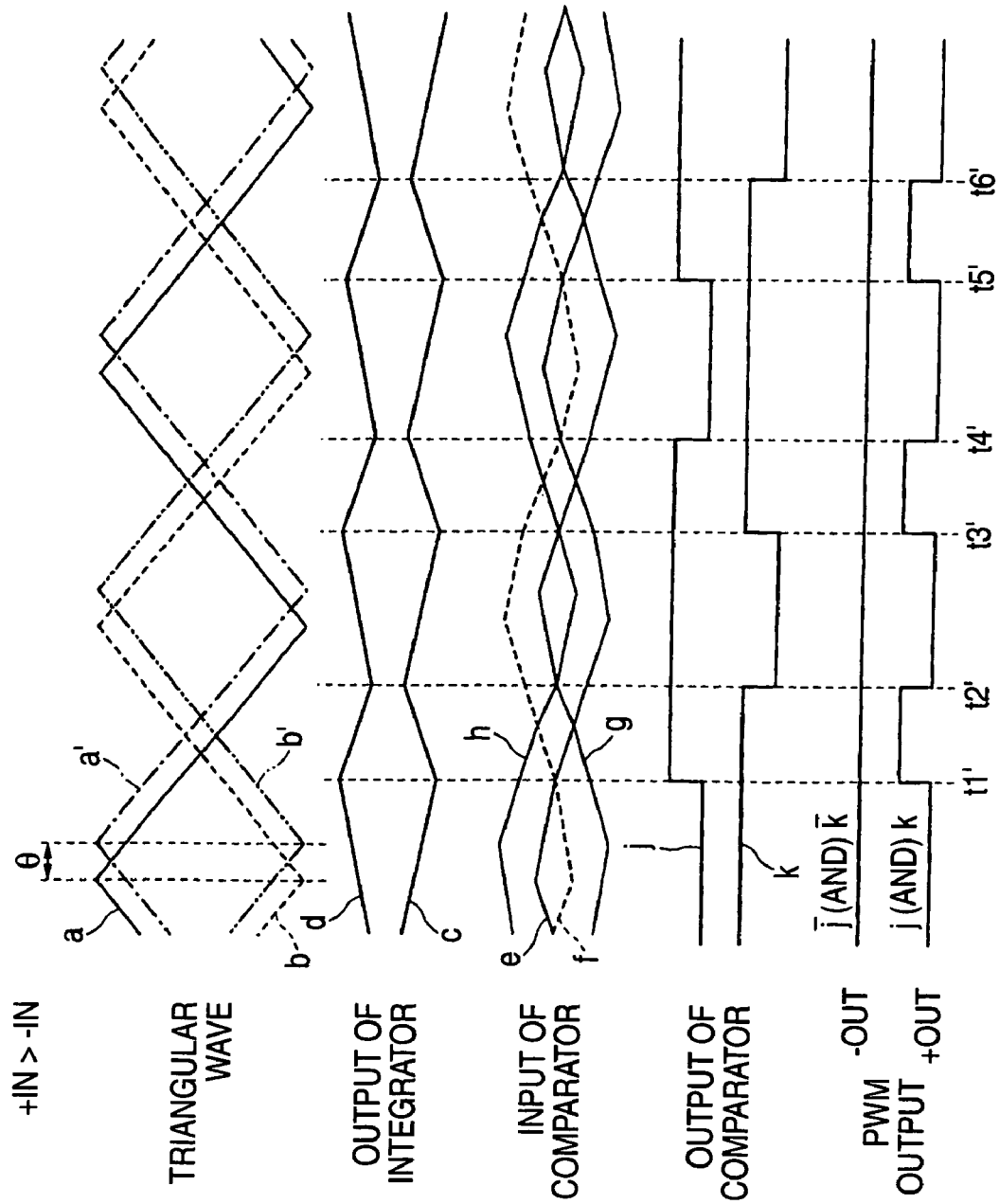
FIG. 3 is a waveform diagram for indicating operations of the class-D amplifier shown in FIG. 1 in the case that a plus value is applied to the class-D amplifier.
Figure 4:
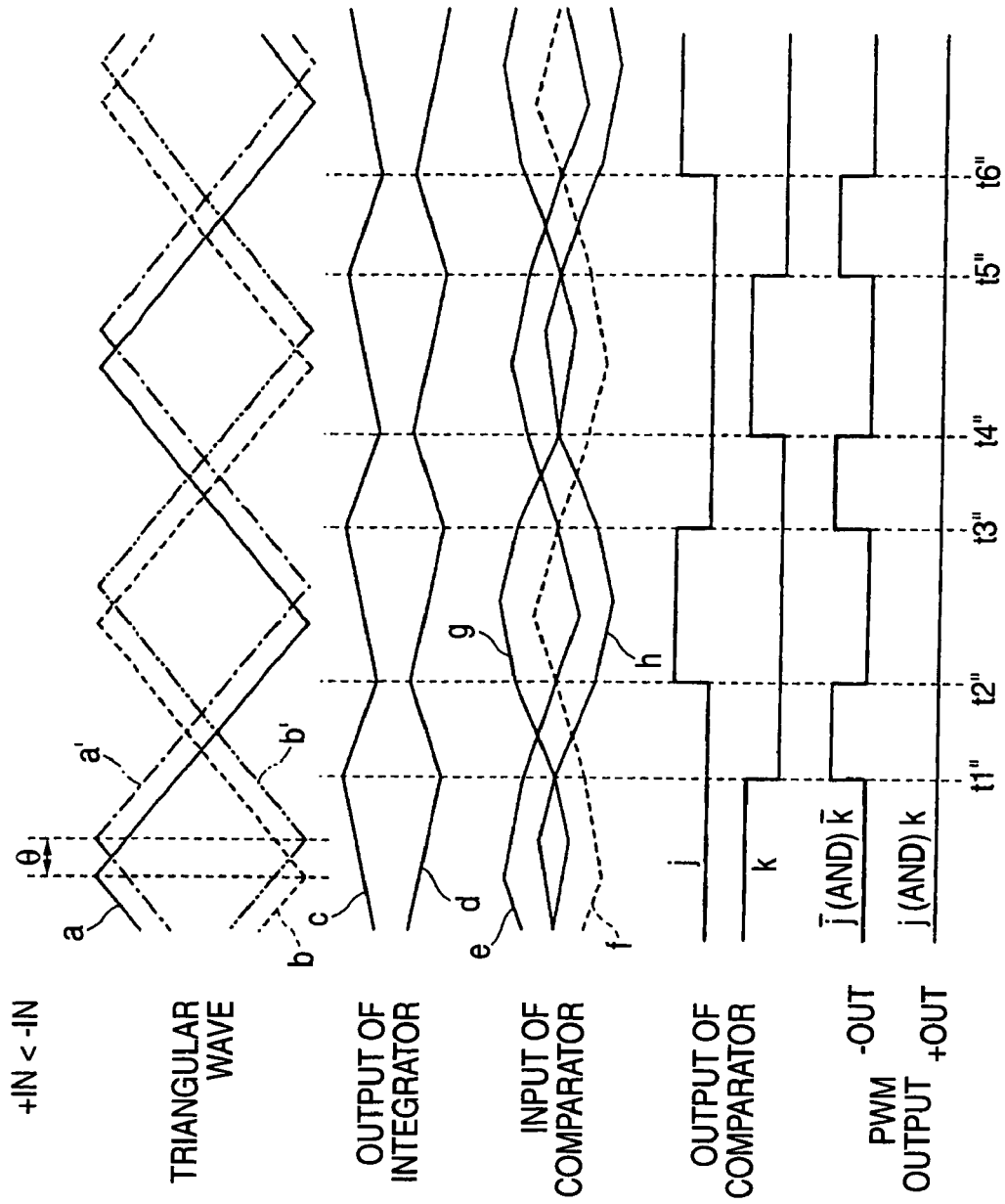
FIG. 4 is a waveform diagram for indicating operations of the class-D amplifier shown in FIG. 1 in the case that a minus value is applied to the class-D amplifier.

Next, a description is made of an example as to operations of the class-D amplifier according to this embodiment 1 with employment of the above-described arrangement with reference to FIG. 2 to FIG. 4. FIG. 2 to FIG. 4 are waveform diagrams for representing operations of respective circuit portions of the class-D amplifier shown in FIG. 1. Then, FIG. 2 shows waveforms of the respective circuit portions of the class-D amplifier when both the value of the analog input signal "+IN" is equal to the value of the analog input signal "−IN", namely when a differential input becomes a zero volt value (no input signal). FIG. 3 represents waveforms of the respective circuit portions of the class-D amplifier when (analog input signal "+IN")>(analog input signal "−IN"), namely, when a differential input becomes plus. FIG. 4 represents waveforms of the respective circuit portions of the class-D amplifier when (analog input signal "+IN")< (analog input signal "−IN"), namely, when a differential input becomes minus.

First, operations as to FIG. 2, namely in the case of no differential input (zero volt value input) will now be explained. The phase of the triangular wave signal "a" is different from the phase of the triangular wave signal "b" by 180 degrees. The triangular wave signal "a'" constitutes such a signal produced by delaying the triangular wave signal "a" by the very small angle "θ." The triangular wave signal "a'" constitutes such a signal produced by delaying the triangular wave signal "a" by the very small angle "θ." In this case, a predetermined noise called as "dither" may be alternatively applied to the triangular wave signals a, a', b, and b', respectively. Since this dither noise is applied to each of the triangular wave signals, distortions of the output waves may be corrected. Instead of these triangular wave signals a, a', b, and b', a sawtooth waveform, an integration waveform, and the like may be alternatively used.

Phase relationships between the triangular wave signals "a", "a'", and the plus-sided output (plus-sided output of operational amplifier 11) "d" of the integrator are substantially equal to each other. Phase relationships between the triangular wave signals "b", "b'", and the minus-sided output (minus-sided output of operational amplifier 11) "c" of the integrator are substantially equal to each other.

The inputs of the compurgators 12 and 13, namely the first to fourth synthesized waves e, f, g, and h own waveforms which are synthesized with the outputs of the integrator. Then, the phase of the first synthesized wave "e" is different from the phase of the second synthesized wave "f" by approximately 180 degrees. The phase of the third synthesized wave "g" is different from the phase of the fourth synthesized wave "h" by approximately 180 degrees. The waveform of the first synthesized wave "e" is substantially equal to the waveform of the fourth synthesized wave "h", and the phases of these first and fourth synthesized waves "e" and "h" are different form each other by the very small angle "θ". The waveform of the second synthesized wave "f" is substantially equal to the waveform of the third synthesized wave "g", and the phases of these second and third synthesized waves "f" and "q" are different form each other by the very small angle "θ."

An output "j" of the comparator 12 becomes "low" when (first synthesized wave "e")>(second synthesized wave "f"), and becomes "high" when (first synthesized wave "e")< (second synthesized wave "f"). An output "k" of the comparator 13 becomes "low" when (third synthesized wave "g")>(fourth synthesized wave "h"), and becomes "high" when (third synthesized wave "g")<(fourth synthesized wave "h"). An output (−OUT) of the AND circuit 31 becomes "high" when the outputs "j" and "k" of the comparators 12 and 13 are "low." An output (+OUT) of the AND circuit 32 becomes "high" when the outputs "j" and "k" of the comparators 12 and 13 are "high."

In other words, the plus-sided output "+OUT" in this class-D amplifier becomes a high level during a time period defined from a cross point (time instant "t1") between the first synthesized wave "e" and the second synthesized wave "f" up to another cross point (time instant "t2") between the third synthesized wave "g" and the fourth synthesized wave "h." The minus-sided output "−OUT" in this class-D amplifier becomes a high level during a time period defined from a cross point (time instant "t3") between the first synthesized wave "e" and the second synthesized wave "f" up to another cross point (time instant "t4") between the third synthesized wave "g" and the fourth synthesized wave "h."

In this case, such a time period during which either the plus-sided output "+OUT" or the minus-sided output "−OUT" may depend upon the phase difference (very small angle "θ") of the triangular wave signals a, a', and the triangular wave signals b, b'. As a consequence, since the delay times in the delay circuits 21 and 22 are made sufficiently short to desirable values so as to decrease the phase differences (very small angle "θ") of the triangular wave signals a, a' and the triangular wave signals b, b', the time period during which both the plus-sided output "+OUT" and the minus-sided output "−OUT" become the high levels can be made sufficiently short to the desirable value. At this time, both the minus-sided output "c" and the plus-sided output "d" of the integrator become very low voltages.

In other words, in the case of no input signal (namely, zero volt value which will be applied to the below-mentioned cases), the high level periods in both the plus-sided output +OUT and the minus-sided output −OUT can be set to duty ratios of 0 to several %. The plus-sided output "+OUT" and the minus-sided output "−OUT" are supplied via, for instance, a low-pass filter to a load such as a speaker. As a result, in the case of no input signal, since the high level periods in both the plus-sided output +OUT and the minus-sided output −OUT are the duty ratios of 0 to several %, the currents flow through the low-pass filter and the load become very small values. As a consequence, in such a case that the class-D amplifier of this embodiment is used for a small signal, the above-described low-pass (LC filter etc.) arranged between the output terminals and the load may be omitted.

With employment of the above-described arrangements, in accordance with the class-D amplifier of the embodiment 1, in such a case that there is no analog input signal (namely, in case of zero volt value input), since the time period during which the output signal becomes the high level can be made sufficiently short to the desirable value, the power loss can be largely reduced, as compared with that of the prior art class-D amplifier.

Next, a description is made of operations of this class-D amplifier in the case that (analog input signal "+IN")> (analog input signal "−IN"), namely when the differential input thereof becomes plus as shown in FIG. 3. It should be noted that the triangular wave signals a, a', b, b' are identical to those of the case shown in FIG. 2. Phase relationships between the triangular wave signals a, a', b, b' and outputs c, d of the integrator (namely, outputs of operational amplifier 11) are identical to those of the case represented in FIG. 2. In FIG. 3, first to fourth synthesized waves e, f, g, h own such waveforms which are synthesized with the outputs of the integrator. Then, a phase of the first synthesized wave "e" is different from a phase of the second synthesized wave "f" by approximately 180 degrees, whereas a phase of the third synthesized wave "g" is different from a phase of the fourth synthesized wave "h" by approximately 180 degrees.

In FIG. 3, a difference between the minus-sided output "c" of the integrator and the plus-sided output "d" of the integrator at the same timing is larger than the difference of the case shown in FIG. 2. Then, both a phase difference between the first synthesized wave "e" and the fourth synthesized wave "h", and another phase difference between the second synthesized wave "f" and the third synthesized wave "g" become larger than those of the case shown in FIG. 2. As a result, a time period defined from a cross point (time instant t1') between the first synthesized wave "e" and the second synthesized wave "f" up to another cross point (time instant t2') is made longer than the time period (from time instant t1 to time instant t2) in the case of FIG. 2, and a time period during which the plus-sided output "+OUT" becomes a high level is made longer than that of the case shown in FIG. 2. In FIG. 3, in such a time period defined from a cross point (time instant t3') between the third synthesized wave "g" and the fourth synthesized wave "h" subsequent to the time instant t2' up to another cross point (time instant t4') between the first synthesized wave "e" and the second synthesized wave "f" is made longer than that of the case of FIG. 2, and the plus-sided output "+OUT" becomes a high level, and, subsequently, these operations are repeatedly carried out.

The output "j" of the comparator 12 becomes "high" from the cross point (time instant t1') between the first synthesized wave "e" and the second synthesized wave "f" up to the cross point (time instant t4') between the next first synthesized wave "e" and the next second synthesized wave "f." Next, the output "j" of the comparator 12 becomes "low" from the time instant t4' up to another cross point (time instant t5') between the next first synthesized wave "e" and the second synthesized wave "f", and subsequently, the above-described operation is repeatedly carried out. In other words, the output "j" of the comparator 12 changes the statuses thereof from "high" to "low", or from "low" to "high" every cross point between the first synthesized wave "e" and the second synthesized wave "f."

The output "k" of the comparator 13 becomes "low" from the cross point (time instant t2') between the third synthesized wave "g" and the fourth synthesized wave "h" up to the cross point (time instant t3') between the next third synthesized wave "g" and the next fourth synthesized wave "h." Next, the output "k" of the comparator 13 becomes "high" from the time instant t3' up to another cross point (time instant t6') between the next third synthesized wave "g" and the fourth synthesized wave "h", and subsequently, the above-described operation is repeatedly carried out. In other words, the output "k" of the comparator 13 changes the statuses thereof from "high" to "low", or from "low" to "high" every cross point between the third synthesized wave "g" and the fourth synthesized wave "h."

Then, since the plus-sided output "+OUT"=the (output j) AND (output "k"), this plus-sided output "+OUT" becomes a "high" level in a time period from the time instant t1' to the time instant t2', in a time period from the time instant t3' to the time instant t4', and in a time period from the time instant t5' to the time instant t6'. As a result, a duty ratio of the time periods during which the plus-sided output "+OUT" becomes the high level is substantially directly proportional to the magnitude of the plus value (differential value) of the analog input signal. In other words, the plus-sided output "+OUT" may constitute such a signal obtained by modulating the plus value (differential value) of the analog input signal in a pulse width modulation (PWM) manner.

On the other hand, the minus-sided output "−OUT" continuously becomes a low level. This is because there is no such a time period that both the outputs "j" and "k" of the comparators 12 and 13 become low when (analog input signal "+IN")>(analog input signal "−IN") shown in FIG. 3.

Next, a description is made of operations of this class-D amplifier in the case that (analog input signal "+IN")< (analog input signal "−IN"), namely when the differential input thereof becomes minus as shown in FIG. 4. It should be noted that the triangular wave signals a, a', b, b' are identical to those of the case shown in FIG. 2. A phase relationship between the triangular wave signals a, a', b, b', and the outputs c, d of the integrator (namely, outputs of operational amplifier 11) is identical to that of the case shown in FIG. 2.

It should be understood that in the case shown in FIG. 4, phases of the outputs "c" and "d" of the integrator are inverted (namely, shift by 180 degrees), as compared with those of the above-described cases of FIG. 2 and FIG. 3. A temporal relationship as to the cross point between the first synthesized wave "e" and the second synthesized wave "f", and the cross point between the third synthesized wave "g" and the fourth synthesized wave "h" is made opposite to that of the case shown in FIG. 3.

The output "j" of the comparator 12 becomes "high"from the cross point (time instant t2") between the first synthesized wave "e" and the second synthesized wave "f" up to the cross point (time instant t3") between the next first synthesized wave "e" and the next second synthesized wave "f." Next, the output "j" of the comparator 12 becomes "low" from the time instant t3" up to another cross point (time instant t6") between the next first synthesized wave "e" and the second synthesized wave "f", and subsequently, the above-described operation is repeatedly carried out. In other words, the output "j" of the comparator 12 changes the statuses thereof from "high" to "low", or from "low" to "high" every cross point between the first synthesized wave "e" and the second synthesized wave "f."

The output "k" of the comparator 13 becomes "low" from the cross point (time instant t1") between the third synthesized wave "g" and the fourth synthesized wave "h" up to the cross point (time instant t4") between the next third synthesized wave "g" and the next fourth synthesized wave "h." Next, the output "k" of the comparator 13 becomes "high" from the time instant t4" up to another cross point (time instant t5") between the next third synthesized wave "g" and the fourth synthesized wave "h", and subsequently, the above-described operation is repeatedly carried out. In other words, the output "k" of the comparator 13 changes the statuses thereof from "high" to "low", or from "low" to "high" every cross point between the third synthesized wave "g" and the fourth synthesized wave "h."

Then, since the plus-sided output "+OUT"=(output j) AND (output k), this plus-sided output "+OUT" continuously becomes a low level. When the (output j) and the (output k) commonly become "low", the minus-sided output "−OUT" becomes "high", and a duty ratio of the time periods during which the minus-sided output "−OUT" becomes the high level is substantially directly proportional to the magnitude of the minus value (differential value) of the analog input signal. In other words, the minus-sided output "−OUT" may constitute such a signal obtained by modulating the minus value (differential value) of the analog input signal in a pulse width modulation (PWM) manner.

As a consequence, in accordance with the class-D amplifier of the embodiment 1, the analog input signal can be converted into the PWM signals having the three values which are constructed of any of the zero volt value, the plus value, and the minus value, and then, these converted PWN signals can be output. In accordance with the class-D amplifier of the embodiment 1, in the case that the value of the analog input signal becomes higher than, or equal to a predetermined value, the output signal thereof becomes such a switching waveform of only one-sided signal of any one of the plus-sided output "+OUT" and the minus-sided output "−OUT" as represented in FIG. 3 and FIG. 4. As a consequence, according to the class-D amplifier of this embodiment 1, the switching loss thereof can be made about half of the switching loss of the conventional class-D amplifier which is switched on both the plus side and the minus side.

In accordance with the class-D amplifier of the embodiment 1, since the analog feedback is realized by employing the resistors R3 and R4, the class-D amplifier can amplify the analog input signals under better linear condition, while such a digital process operation as described in the above-explained patent publication 2 is not carried out. In accordance with the class-D amplifier of the embodiment 1, different from the amplifier described in the above-explained patent publication 1, while a transformer used in an impedance conversion and used to cut off a DC voltage is no longer required, such a class-D amplifier having low power loss and low distortion can be provided, the DC output component of which is made nearly equal to zero volt.

Embodiment 2

Figure 5:
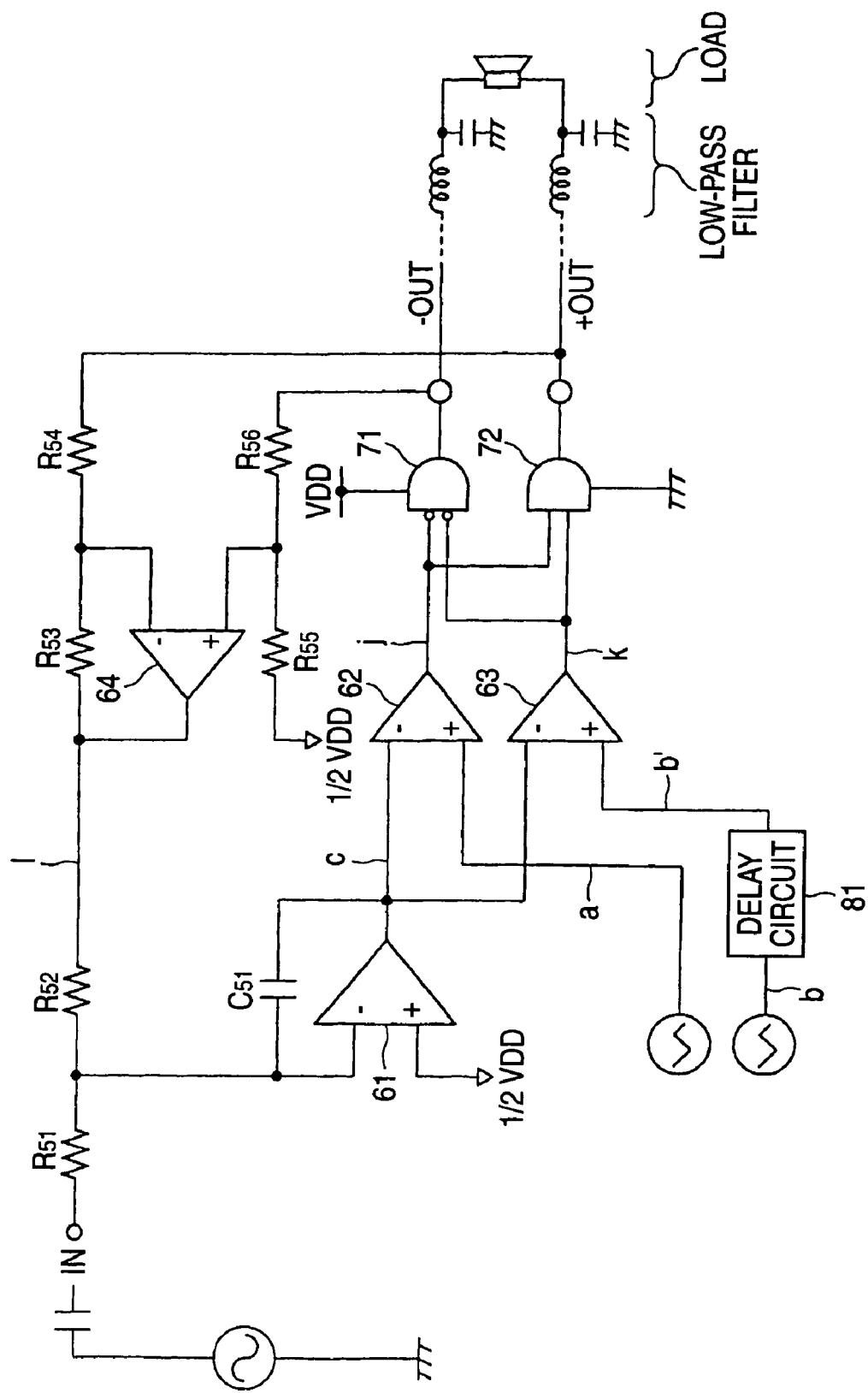
FIG. 5 is a circuit diagram for representing a structural example of a class-D amplifier according to an embodiment 2 of the present invention.

Next, an embodiment 2 of the present invention will now be described with reference to FIG. 5. FIG. 5 is a circuit diagram for indicating a structural example of a class-D amplifier according to the embodiment 2 of the present invention. This class-D amplifier is arranged by resistors R51, R52, R53, R54, R55, and R56, a capacitor C51, operational amplifiers 61 and 64, comparators 62 and 63, an AND circuit (low active) 71, and another AND circuit 72. A triangular wave signal "a" is applied to a plus-sided input terminal of the comparator 62, another triangular wave signal "b'" is applied to a plus-sided input terminal of the comparator 63.

The triangular wave signal "b'" corresponds to such a triangular wave signal which is produced by that a phase of a triangular wave signal "b" obtained by inverting the triangular wave signal "a" (namely, phase is delayed by the 180 degrees) is further delayed by a very small angle "θ." As a result, both the triangular wave signal "a" and the triangular wave signal "b'" are the same waveform signals, the phases of which are different from each other by (180 degrees +very small angle "θ"). In this case, a predetermined noise called as "dither" may be alternatively applied to the triangular wave signals a and b', respectively. Since this dither noise is applied to each of the triangular wave signals, distortions of the output waves may be corrected. Instead of these triangular wave signals a and b', a sawtooth waveform, an integration waveform, and the like may be alternatively used.

One terminal of the resistor R51 constitutes an input terminal of an analog input signal. Then, the other terminal of the resistor R51 is connected to a minus-sided input terminal of the operational amplifier 61. Both the operational amplifier. 61 and the capacitor C51 constitute an integrator. The comparator 62 compares the triangular wave signal "a" with an output "c" of the integrator, and then outputs a comparison result (output "j"). The comparator 63 comparates the triangular wave signal "b'" with the output "c" of the integrator, and then, outputs a comparison result (output "k").

The AND circuit 71 corresponds to a buffer circuit having an AND gating function of low active. Then, when both the output "j" of the first comparator 62 and the output "k" of the second comparator 63 are "low", this AND circuit 71 outputs a "high" level signal, and outputs this calculation signal as a minus-sided output "−OUT" of this class-D amplifier. The AND circuit 72 corresponds to a buffer circuit having an AND gating function. Then, when both the output "j" of the first comparator 62 and the output "k" of the second comparator 63 are "high", this AND circuit 72 outputs a "high" level signal, and outputs this calculation signal as a plus-sided output "+OUT" of this class-D amplifier.

The operational amplifier 64, and the resistors R53, R54, R55, R56 constitute a differential amplifier which amplifies a difference between the plus-sided output "+OUT" and the minus-sided output "−OUT." An output "l" of this differential amplifier is fed back via the resistor R52 to the input side of the operational amplifier 61 (namely, input side of class-D amplifier). As a consequence, the operational amplifier 64 and the resistors R52, R53, R54, R55, R56 constitute a feedback circuit.

Next, a description is made of operations as to the class-D amplifier according to this embodiment 2 with the above-described circuit arrangement. In the case that an analog input signal is equal to zero volt (no input signal), namely, "IN" is equal to "½ VDD", both a plus-sided output "+OUT" and a minus-sided output "−OUT" are represented as in FIG. 6, and a duty ratio during a high level period becomes nearly equal to zero to several %. As a result, when the analog input signal is equal to zero volt (no input signal), a current which flows from this class-D amplifier via the filter to the load becomes a very small value.

In the case that the analog input signal is plus, both the plus-sided output "+OUT" and the minus-sided output "−OUT" become similar to those of FIG. 3. As a consequence, the plus-sided output "+OUT" becomes such a signal produced by modulating a plus value (namely, "plus" while zero volt is employed as a reference value) of the analog input signal in the pulse width modulation manner. On the other hand, the minus-sided output "−OUT" continuously becomes a low level.

In the case that the analog input signal is minus, both the plus-sided output "+OUT" and the minus-sided output "−OUT" become similar to those of FIG. 4. As a consequence, the minus-sided output "−OUT" becomes such a signal produced by modulating a minus value (namely, "minus" while ½ VDD is employed as a reference value) of the analog input signal in the pulse width modulation manner. On the other hand, the plus-sided output "+OUT" continuously becomes a low level.

Similar to the class-D amplifier according to the above-described embodiment 1, with employment of the above-described arrangements, in accordance with the class-D amplifier of the embodiment 2, in such a case that there is no analog input signal (namely, in case of zero volt value input), since the time period during which the output signal becomes the high level can be made sufficiently short to the desirable value, the power loss can be largely reduced, as compared with that of the prior art class-D amplifier.

As a consequence, in accordance with the class-D amplifier of the embodiment 2, the analog input signal can be converted into the PWM signals having the three values which are constructed of any of the zero volt value, the plus value, and the minus value, and then, these converted PWN signals can be output. In accordance with the class-D amplifier of the embodiment 2, in the case that the value of the analog input signal becomes higher than, or equal to a predetermined value, the output signal thereof becomes such a switching waveform of only one-sided signal of any one of the plus-sided output "+OUT" and the minus-sided output "−OUT" in a similar manner represented in FIG. 3 and FIG. 4. As a consequence, according to the class-D amplifier of this embodiment 2, the switching loss thereof can be made about half of the switching loss of the conventional class-D amplifier which is switched on both the plus side and the minus side.

In accordance with the class-D amplifier of the embodiment 2, since the analog feedback is realized by employing the operational amplifier 64, and the resistors R52, R53, R54, R55, R56, the class-D amplifier can amplify the analog input signals under better linear condition, while such a digital process operation as described in the above-explained patent publication 2 is not carried out. In accordance with the class-D amplifier of the embodiment 2, different from the amplifier described in the above-explained patent publication 1, while a transformer used in an impedance conversion and used to cut off a DC voltage is no longer required, such a class-D amplifier having low power loss and low distortion can be provided, the DC output component of which is made nearly equal to zero volt.

Figure 7A:
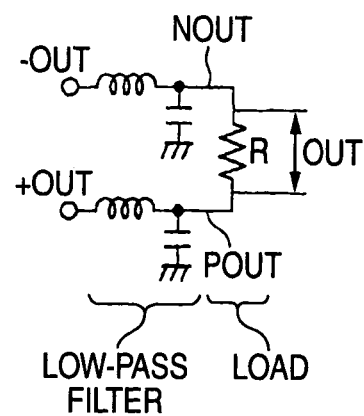
FIGS. 7A to 7C are diagrams for showing an example of waveforms appeared in a load when a sine wave is input to the class-D amplifier according to either the embodiment 1 or the embodiment 2 of the present invention.
Figure 7B:
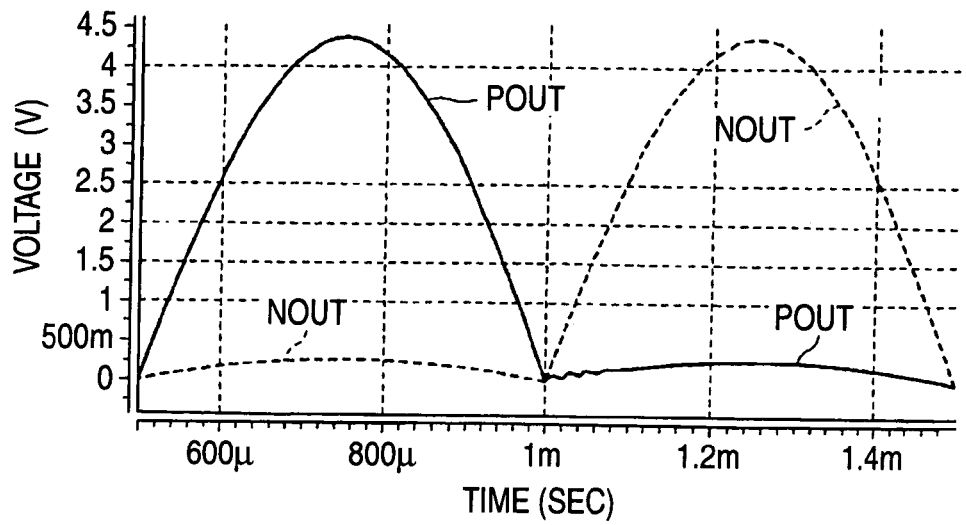
Figure 7C:
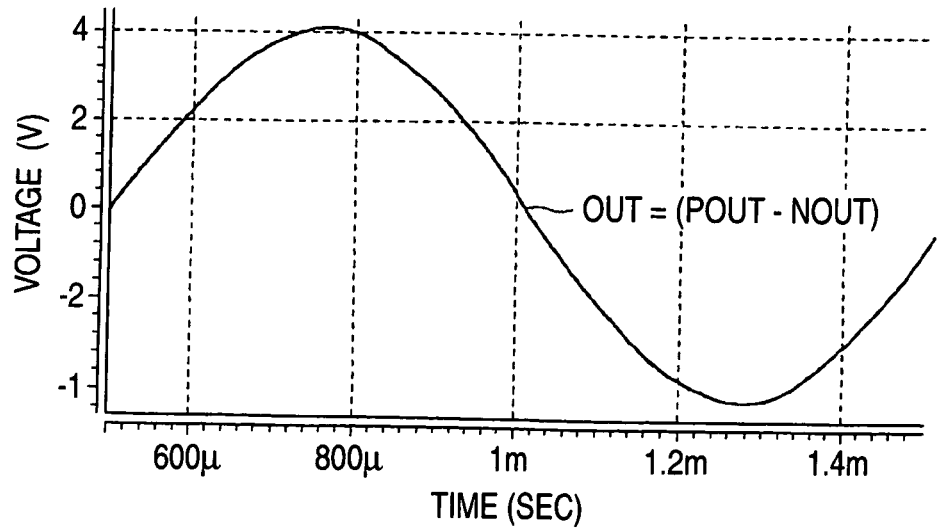

Next, FIGS. 7A to 7C show examples of output waveforms in such a case that a sine wave is input to the analog signal input terminal of the class-D amplifier according to either the embodiment 1 or the embodiment 2, shown in either FIG. 1 or FIG. 5. In both the embodiment 1 and the embodiment 2, in the case that the sine wave is entered to the analog signal input terminal, output waveforms are similar to each other. FIG. 7(a) shows both a low-pass filter and a load (resistor R), which are connected to both the plus-sided output "+OUT" and the minus-sided output "−OUT" of the class-D amplifier according to either the embodiment 1 or the embodiment 2. FIG. 7(b) indicates that such a waveform is shown as an output "POUT" after the plus-sided output "+OUT" in this class-D amplifier has passed through the low-pass filter. In FIG. 7(b), such a waveform is shown as an output "NOUT" after the minus-sided output "−OUT" in this class-D amplifier has passed through the low-pass filter. Both the output POUT and the output NOUT become such waveforms that only upper half waveforms of a sine wave. However, an output "OUT" corresponding to a signal applied to the load as shown in FIG. 7(c) becomes a sine wave. This reason is given as follows: That is, since the load (speaker etc.) is connected between the output POUT and the output NOUT (namely, between plus-sided output terminal "POUT" and minus-sided output terminal "NOUT" of low-pass filter), as represented in FIG. 7(c), the output "OUT" corresponding to such a signal applied to this load becomes a difference between the output POUT and the output NOUT (OUT=POUT−NOUT), thus constitutes a sine wave.

In the class-D amplifiers according to both the embodiment 1 and the embodiment 2 shown in FIG. 1 and FIG. 5, at least both the triangular wave signal "a" and the triangular wave signal "b'" which is obtained by inverting the triangular wave signal "a" and further by delaying this inverted triangular wave signal "a" are used. As a result, even when no analog input signal is present in the class-D amplifiers according to the embodiment 1 and the embodiment 2, similar to FIG. 2 and FIG. 6, both the plus-sided output "+OUT" and the minus-sided output "−OUT" are output for a short time (duty ratio of high level period is set to zero to several %), so that voltages are slightly output to the low-pass filter (outputs POUT, NOUT). At this time, since such a voltage defined by the output POUT—the output NOUT is applied to the load, the output OUT corresponding to the signal which is applied to this load becomes zero volt. As a consequence, in such a case that the analog input terminal is changed from a non-signal status to such a status that a small signal is input, the class-D amplifiers according to the embodiment 1 and the embodiment 2 can supply the amplified signals having the low distortions to the load even when the statuses thereof are changed.

Embodiment 3

Figure 8:
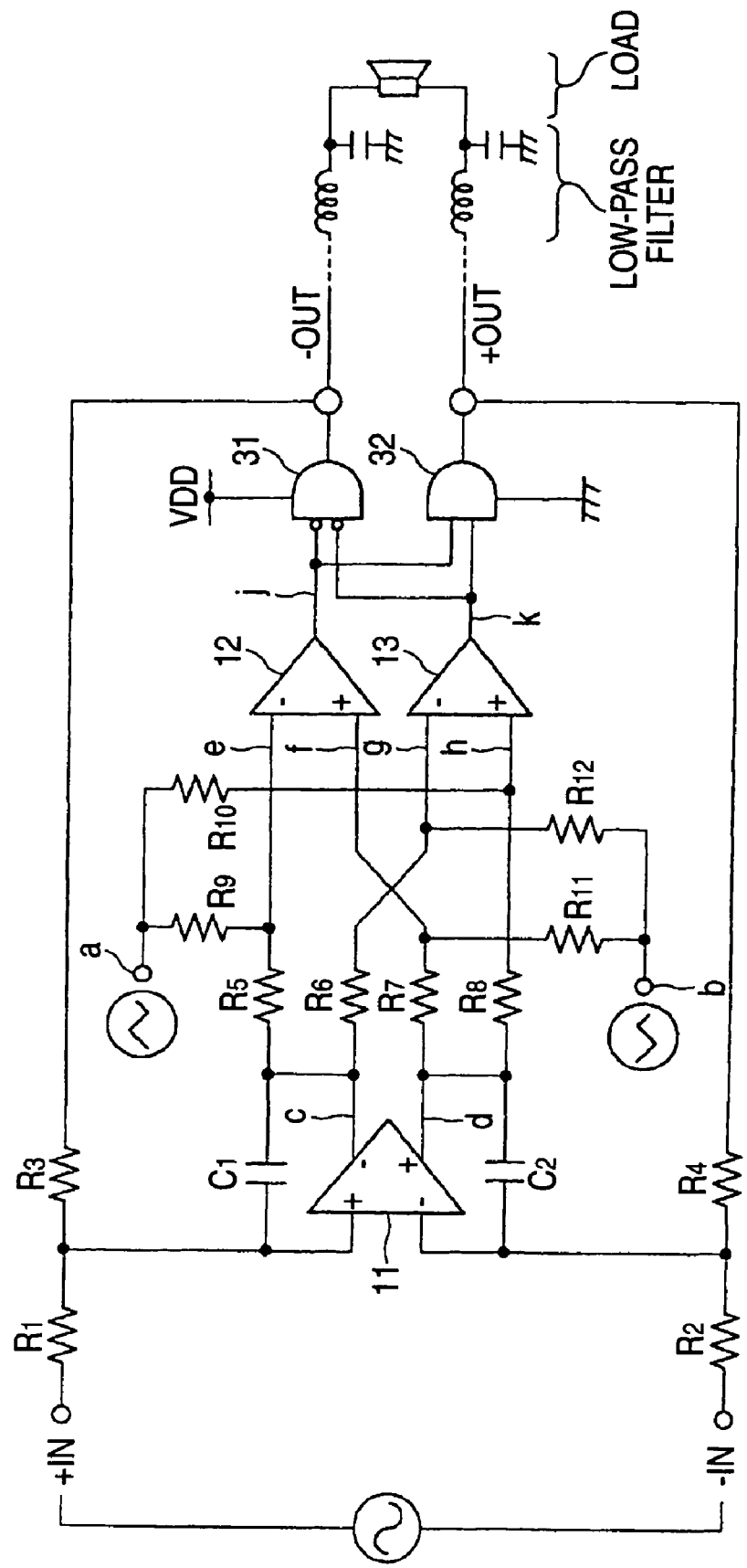
FIG. 8 is a circuit diagram for representing a structural example of a class-D amplifier according to an embodiment 3 of the present invention.

Next, an embodiment 3 of the present invention will now be described with reference to FIG. 8 to FIG. 11. FIG. 8 is a circuit diagram for representing a structural example of a class-D amplifier according to the embodiment 3 of the present invention. Different from the class-D amplifier according to the embodiment 1, in this class-D amplifier, the delay circuits 21 and 22 are not employed as the structural elements. In this class D amplifier, a triangular wave signal "a" is applied to one terminal of a resistor R10, whereas another triangular wave signal "b" is applied to one terminal of another resistor R12. Structural circuit arrangement other than the above-described circuit arrangement in the class-D amplifier shown in FIG. 8 are similar to those of the class-D amplifier according to the embodiment 1 shown in FIG. 1. It should be understood that respective resistance values of resistors R5, R6, R7, R8, R9, R10, R11, and R12, which constitute a synthesizing circuit in this class-D amplifier, have been set under such a condition which is not defined in the resistors R5, R6, R7, R8, R9, R10, R11, and R12 of the class-D amplifier according to the embodiment 1. The structural circuit arrangements of this class-D amplifier will be explained in detail.

This class-D amplifier is arranged by resistors R1, R2, R3, R4, R5, R6, R7, R8, R9, R10, R11, and R12, capacitors C1 and C2, an operational amplifier 11, comparators 12 and 13, an AND circuit (low active) 31, and another AND circuit 32. A predetermined triangular wave signals "a" is applied to one terminals of the resistors R9 and R11 respectively in this drawing. A predetermined triangular wave signal is applied to one terminals of the resistors R11 and R12 respectively in this drawing. Both the triangular wave signal "a" and the triangular wave signal "b" are such signals having the same waveforms, the phases of which are different from each other by 180 degrees. Assuming now that the triangular wave signal "a" is set to such a triangular wave in the present invention related to Claim 6, the triangular wave signal "b" corresponds to a triangular wave having an opposite phase in the present invention.

One terminal of the resistors R1 and R2 constitute differential input terminals of analog input signals, respectively. Then, one terminal of the resistor R1 constitutes a plus-sided input terminal (+IN), and one terminal of the resistor R2 constitutes a minus-sided input terminal (−IN). The operational amplifier 11, and the capacitors C1 and C2 constitute an integrator. The analog input signals which have been input in the differential manner by the resistors R1 and R2 are integrated by this integrator, and the integrated signal is output to the resistors R5, R6, R7, and R8.

The resistors R5, R6, R7, R8, R9, R10, R11, and R12 constitute a synthesizing circuit which synthesizes the triangular wave signals "a'" or "b'" with the output signal of the integrator. This synthesizing circuit produces four sorts of first to fourth synthesized waveforms "e", "f", "g", "h."

The respective resistance values of the resistors R5, R6, R7, R8, R9, R10, R11, and R13, which constitute the synthesizing circuit, are determined in such a manner that time differences (phase differences) are produced between the first synthesized wave "e" and the second synthesized wave "f", and between the third synthesized wave "g" and the fourth synthesized wave "h", which correspond to the output signals of this synthesizing circuit based upon these resistance values, and input capacitance as to the comparator 12 (first comparator) and the comparator 13 (second comparator).

In this circuit, the resistor R5 corresponds to a first resistor in the present invention related to Claim 7. the resistor R6 corresponds to a fifth resistor in the present invention. The resistor R7 corresponds to a third resistor in the present invention. The resistor R9 corresponds to a second resistor in the present invention. The resistor RIO corresponds to an eight resistor in the present invention. The resistor R11 corresponds to a fourth resistor in the present invention. The resistor R12 corresponds to a sixth resistor in the present invention.

The above-described synthesizing circuit contains a first synthesizing circuit through a fourth synthesizing unit. The first synthesizing unit synthesizes a minus-sided output of the operational amplifier 11 which constitutes the integrator with the triangular wave signal "a" so as to produce the first synthesized wave "e." Then, the first synthesizing unit owns the resistor R5 (first resistor) whose one terminal is connected to the minus-sided output of the operational amplifier 11, and the resistor R9 (second resistor). The triangular wave "a" is applied to one terminal of this resistor R9. The other terminal of the resistor R5 is connected to the other terminal of the resistor R9 so as to constitute the output terminal.

The second synthesizing unit synthesizes a plus-sided output of the operational amplifier 11 with the triangular wave signal "b" so as to produce the second synthesized wave "f." Then, the second synthesizing unit owns the resistor R7 (third resistor) whose one terminal is connected to the plus-sided output of the operational amplifier 11, and the resistor R11 (fourth resistor). The triangular wave "b" is applied to one terminal of this resistor R11. The other terminal of the resistor R7 is connected to the other terminal of the resistor R11 so as to constitute the output terminal.

The third synthesizing unit synthesizes the minus-sided output of the operational amplifier 11 with the triangular wave signal "b" so as to produce the third synthesized wave "g." Then, the third synthesizing unit owns the resistor R6 (fifth resistor) whose one terminal is connected to the minus-sided output of the operational amplifier 11, and the resistor R12 (sixth resistor). The triangular wave "b" is applied to one terminal of this resistor R12. The other terminal of the resistor R6 is connected to the other terminal of the resistor R12 so as to constitute the output terminal.

The fourth synthesizing unit synthesizes the plus-sided output of the operational amplifier 11 with the triangular wave signal "a" so as to produce the fourth synthesized wave "h." Then, the fourth synthesizing unit owns the resistor R8 (seventh resistor) whose one terminal is connected to the plus-sided output of the operational amplifier 11, and the resistor R10 (eighth resistor). The triangular wave "a" is applied to one terminal of this resistor R10. The other terminal of the resistor R8 is connected to the other terminal of the resistor R10 so as to constitute the output terminal.

Preferably, the respective resistance values of the resistors R5, R7, R9, and R11 (first to fourth resistors) which are connected to the comparator 12 may be set to such resistance values obtained by multiplying the respective resistance values of the resistors R6, R8, R10, and R12 (fifth to eighth resistors) which are connected to the comparator 13 by such values except for "1."

For instance, the resistance values of the resistors R5, R7, R9, R11, and the resistance values of the resistors R5, R8, R10, R12 are set as follows:

$R6=R8=R5 \times \alpha, R5=R7,$ $R10=R12=R9 \times \alpha, R9=R11,$

In these formulae, symbol "α" is not equal to 1.

As apparent from the condition of the above-described formulae, the following resistance value setting conditions may be alternatively established:

$R5=R7=R9=R11$, or

R5=R7 being not equal to R9=R11.

Then, under such a condition that (R6=R8) and (R10=R12), it is so assumed that (R6, R8, R10, R12) is equal to (R5, R7, R9, R11) multiplied by "α" (otherwise, 1/α).

As a concrete example, assuming now that the respective resistance values of the resistors R5, R7, R9, R11 are set to 1 [KΩ], the resistance values of the resistors R6, R8, R10, R12 may be alternatively set to 2 [KΩ], or 500 [Ω]. At this time, symbol "α" is equal to 0.5.

Assuming now that the respective resistance values of the resistors R5, R7, R9, R11 are set to 20 [KΩ], the resistance values of the resistors R6, R8, R10, R12 may be alternatively set to 30 [KΩ]. At this time, symbol "α" is equal to 1.5.

Assuming now that the respective resistance values of the resistors R5, R7, R9, R11 are set to 1 [KΩ], the resistance values of the resistors R6, R8, R10, R12 may be alternatively set to 30 [KΩ]. At this time, symbol "α"is equal to 30.

As apparent from the foregoing descriptions, the above-described synthesizing circuits can establish the time differences (phase differences) between the first synthesized wave "e" and the second synthesized wave "f", and between the third synthesized wave "g" and the fourth synthesized wave "h" by utilizing the differences between the resistance values of the resistors R5, R7, R9, R11 connected to the comparator 12, and the resistors R6, R8, R10, R12 connected to the comparator 13, and further, the input capacitances of the comparators 12 and 13.

The comparator 12 (first comparator) compares the first synthesized wave "e" with the second synthesized wave "f" to output a comparison result. When the first synthesized wave "e" is larger than the second synthesized wave "f", the first comparator 12 outputs a predetermined "low" level signal (for example, zero level), whereas when the first synthesized wave "e" is smaller than the second synthesized wave "f", the first comparator 12 outputs a predetermined "high" level signal. The comparator 13 (second comparator) compares the third synthesized wave "g" with the second synthesized wave "h" to output a comparison result. When the third synthesized wave "g" is larger than the fourth synthesized wave "h", the second comparator 13 outputs a predetermined "low" level signal (for example, zero level), whereas when the third synthesized wave "g" is smaller than the fourth synthesized wave "h", the second comparator 13 outputs a predetermined "high" level signal.

The AND circuit 31 corresponds to a buffer circuit having an AND gating function of a negative logic input. Then, the AND circuit 31 executes an AND calculation (low active) in which when both the output of the first comparator 12 and the output of the second comparator 13 are "low", this AND circuit 31 outputs a "high" level signal, and outputs this calculation result as a minus-sided output "−OUT" of this class-D amplifier. The resistor R3 constitutes a first feedback circuit. The first feedback circuit feeds back the output of the AND circuit 31 which functions as the buffer to the plus-sided input of the operational amplifier 11.

The AND circuit 32 corresponds to a buffer circuit having an AND calculating function, and executes the AND calculating operation between the output of the comparator 12 and the output of the comparator 13, and then, outputs the calculation result as a plus-sided output "+OUT" of this class-D amplifier. The resistor R4 constitutes a second feedback circuit. The second feedback circuit feeds back the output of the AND circuit 32 which functions as the buffer to the minus-sided input of the operational amplifier 11.

A load (speaker etc.) is connected via a low-pass filter between the plus-sided output "+OUT" of this class-D amplifier and the minus-sided output "−OUT" thereof. Since these circuit arrangements are employed, this class-D amplifier can amplify the analog input signals "+IN" and "−IN" in a low distortion without employing a transformer, and further, can drive the load, while power loss is reduced.

Figure 9:
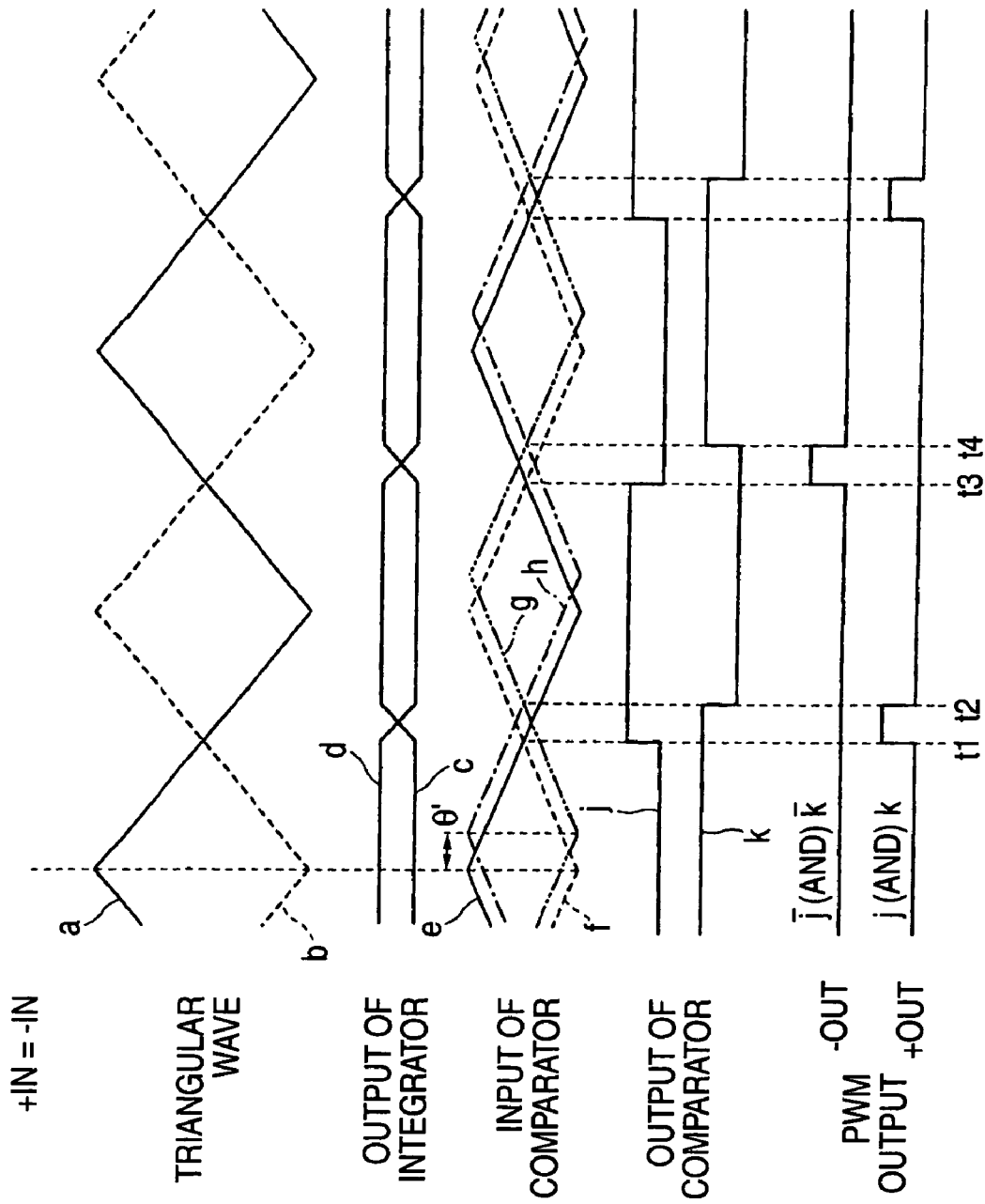
FIG. 9 is a waveform diagram for indicating operations of the class-D amplifier shown in FIG. 8 in the case that zero volt is applied to the class-D amplifier.
Figure 10:
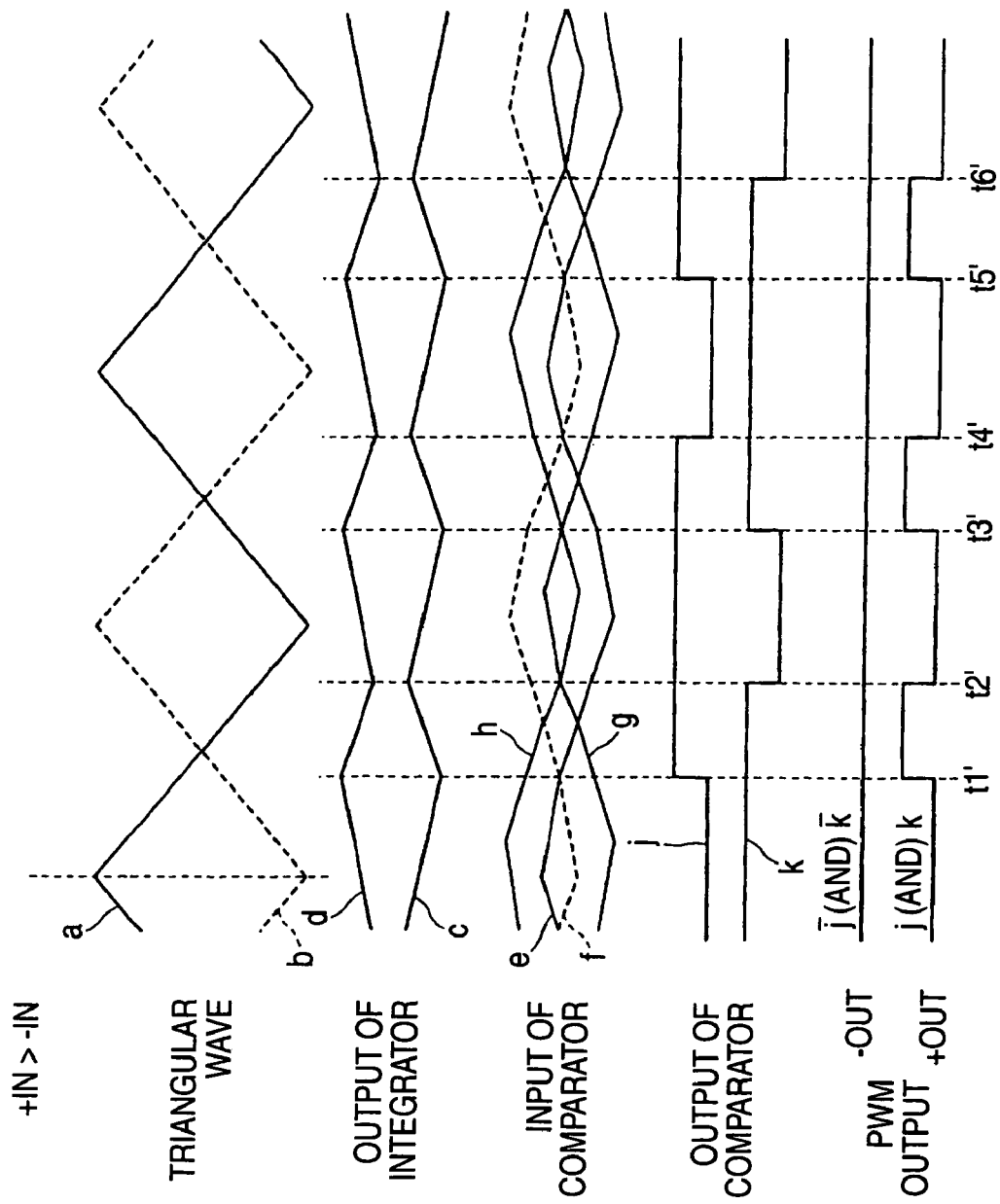
FIG. 10 is a waveform diagram for indicating operations of the class-D amplifier shown in FIG. 8 in the case that a plus value is applied to the class-D amplifier.
Figure 11:
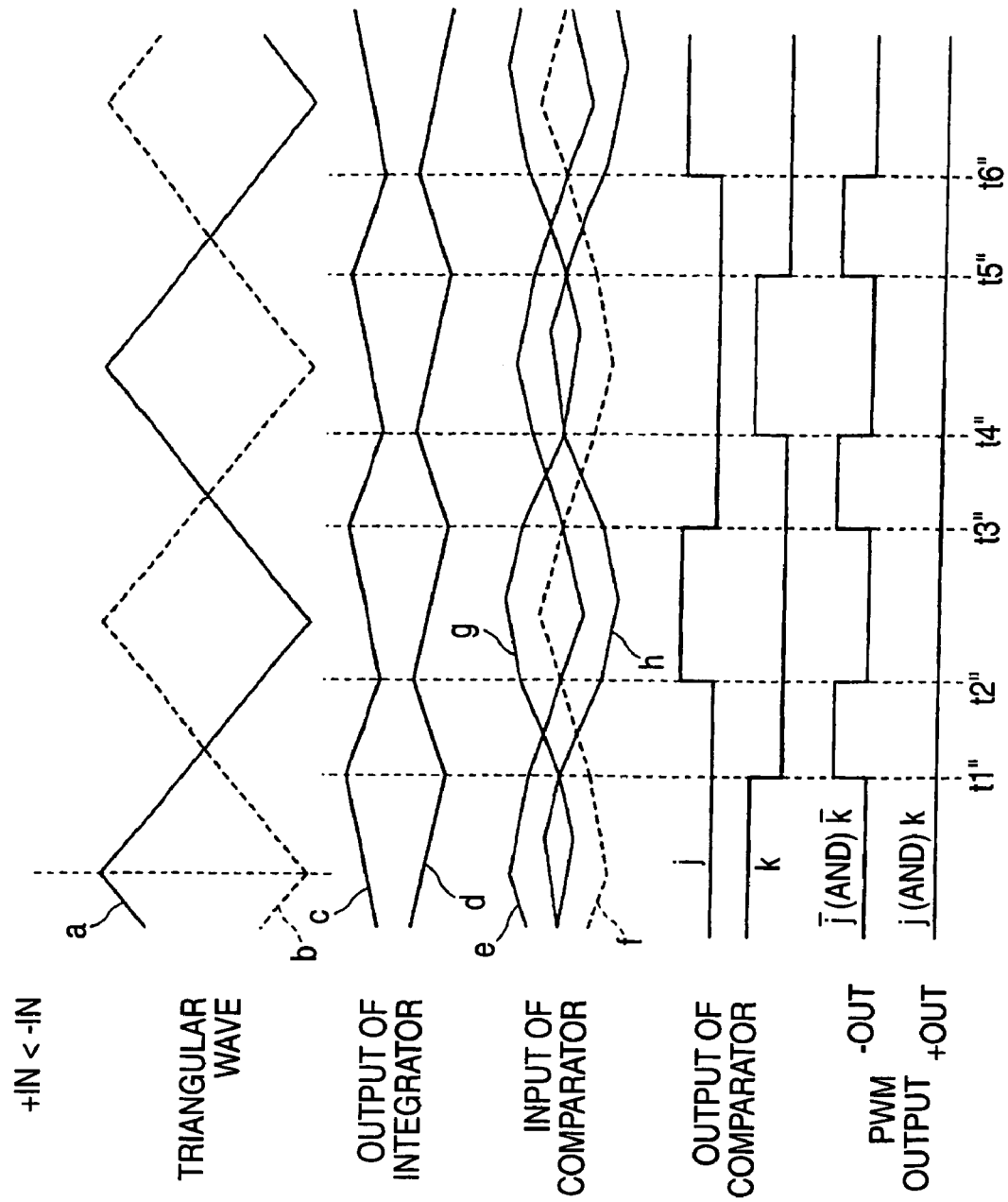
FIG. 11 is a waveform diagram for indicating operations of the class-D amplifier shown in FIG. 1 in the case that a minus value is applied to the class-D amplifier.

Next, a description is made of an example as to operations of the class-D amplifier according to this embodiment 3 with employment of the above-described arrangement with reference to FIG. 9 to FIG. 11. FIG. 9 to FIG. 11 are waveform diagrams for representing operations of respective circuit portions of the class-D amplifier shown in FIG. 8. Then, FIG. 9 shows waveforms of the respective circuit portions of the class-D amplifier when both the value of the analog input signal "+IN" is equal to the value of the analog input signal "−IN", namely when a differential input becomes a zero volt value (no input signal). FIG. 10 represents waveforms of the respective circuit portions of the class-D amplifier when (analog input signal "+IN")>(analog input signal "−IN"), namely, when a differential input becomes plus. FIG. 11 represents waveforms of the respective circuit portions of the class-D amplifier when (analog input signal "+IN")< (analog input signal "−IN"), namely, when a differential input becomes minus.

As indicated from FIG. 9 to FIG. 11, major operation portions of the respective circuit portions in the class-D amplifier according to this embodiment 3 are identical to those of the respective circuit portions of the class-D amplifier according to the embodiment 1 shown in FIG. 2 to FIG. 4. However, this class-D amplifier owns the following different operations. That is, two sets of triangular wave signals "a" and "b" are employed as triangular wave signals, which is different from the class-D amplifier according to the embodiment 1 which employs 4 sets of the triangular wave signals a, a', b, and b'. Next, operations of the respective circuit portions in this class-D amplifier will now be described in detail.

First, operations as to FIG. 9, namely in the case of no differential input (zero volt value input) will now be explained. The phase of the triangular wave signal "a" is different from the phase of the triangular wave signal "b" by 180 degrees. In this case, a predetermined noise called as "dither" may be alternatively applied to the triangular wave signals a and b respectively. Since this dither noise is applied to each of the triangular wave signals, distortions of the output waves may be corrected. Instead of these triangular wave signals a and b, a sawtooth waveform, an integration waveform, and the like may be alternatively used.

Phase relationships between the triangular wave signals "a" and the plus-sided output (plus-sided output of operational amplifier 11) "d" of the integrator are substantially equal to each other. Phase relationships between the triangular wave signals "b" and the minus-sided output (minus-sided output of operational amplifier 11) "c" of the integrator are substantially equal to each other.

The inputs of the compurgators 12 and 13, namely the first to fourth synthesized waves e, f, g, and h own waveforms which are synthesized with the outputs of the integrator. Then, the phase of the first synthesized wave "e" is different from the phase of the second synthesized wave "f" by approximately 180 degrees. The phase of the third synthesized wave "g" is different from the phase of the fourth synthesized wave "h" by approximately 180 degrees. The waveform of the first synthesized wave "e"is substantially equal to the waveform of the fourth synthesized wave "h", and the phases of these first and fourth synthesized waves "e"and "h" are different form each other by the very small angle "θ." The waveform of the second synthesized wave "f" is substantially equal to the waveform of the third synthesized wave "g", and the phases of these second and third synthesized waves "f" and "q" are different form each other by the very small angle "θ'."

As previously explained, the reason why the very small angle θ' is produced between the first synthesized waveform "e" and the fourth synthesized waveform "h", and between the second synthesized waveform "f" and the third synthesized waveform "g" is given as follows. That is to say, the respective resistance values of the resistors R5, R7, R9, and R11 which are connected to the comparator 12 have been set to such resistance values obtained by multiplying the respective resistance values of the resistors R6, R8, R10, and R12 which are connected to the comparator 13 by such values except for "1." In other words, based upon these resistance values and the input capacitances of the comparators 12 and 13, the phase differences of the above-described very small angle θ' are produced. It should be understood that this very small angle θ' corresponds to the very small angle θ appeared in the operating waveforms of the class D amplifier according to the embodiment 1 shown in FIG. 2. Then, this very small angle θ' may be adjusted in a simple manner by adjusting the resistance values of the resistors R5 to R12.

Outputs "j" and "k" of the comparators 12 and 13 own the same waveforms as those of the outputs "j" and "k" of the comparators 12 and 13 of the class-D amplifier according to the embodiment 1 shown in FIG. 2. A plus-sided output "+OUT" and a minus-sided output "−OUT" of this class-D amplifier own the same waveforms as those of the plus-sided output "+OUT" and the minus-sided output "−OUT" of the class-D amplifier according to the embodiment 1 shown in FIG. 2. As explained above, the operations of both the comparator 12, 13 and the AND circuits 31, 32 employed in this class-D amplifier are identical to those of both the comparators 12, 13 and the AND circuits 31, 32 of the class-D amplifier according to the embodiment 1. Operations of both the feedback circuit (resistors R3 and R4) and the integrator (operational amplifier 11 and capacitors C1, C2) employed in this class-D amplifier are identical to the operations of both the feedback circuit and the integrator employed in the class-D amplifier according to the embodiment 1.

As a consequence, similar to the class-D amplifier according to the embodiment 1, in this class-D amplifier, when no input signal is supplied, the high level periods in both the plus-sided output +OUT and the minus-sided output −OUT can be set to duty ratios of 0 to several %. As a consequence, in such a case that the class-D amplifier of this embodiment is used for a small signal, the above-described low-pass (LC filter etc.) arranged between the output terminals and the load may be omitted.

With employment of the above-described arrangements of this class-D amplifier, similar to the class-D amplifier of the embodiment 1, in such a case that there is no analog input signal (namely, in case of zero volt value input), since the time period during which the output signal becomes the high level can be made sufficiently short to the desirable value, the power loss can be largely reduced, as compared with that of the prior art class-D amplifier.

Next, a description is made of operations of this class-D amplifier in the case that (analog input signal "+IN")> (analog input signal "−IN"), namely when the differential input thereof becomes plus as shown in FIG. 10. When FIG. 10 is compared with FIG. 3, there is only such a different point that two sets of the triangular wave signals "a" and "b" are employed as the triangular wave in this class-D amplifier. As a consequence, even in such a case that the differential input is plus, this class-D amplifier can be operated in the same manner to that of the class-D amplifier according to the embodiment 1 except for the portion of the synthesizing circuits. As a consequence, in this class-D amplifier, when the differential input is plus, the plus-sided output "+OUT" becomes such a signal produced by modulating the plus value (differential value) of the analog input signal in the pulse width modulation manner, and the minus-sided output "−OUT" continuously becomes a low level.

Next, a description is made of operations of this class-D amplifier in the case that (analog input signal "+IN")< (analog input signal "−IN"), namely when the differential input thereof becomes minus as shown in FIG. 11. When FIG. 11 is compared with FIG. 4, there is only such a different point that two sets of the triangular wave signals "a" and "b" are employed as the triangular wave in this class-D amplifier. As a consequence, even in such a case that the differential input is minus, this class-D amplifier can be operated in the same manner to that of the class-D amplifier according to the embodiment 1 except for the portion of the synthesizing circuits. As a consequence, in this class-D amplifier, when the differential input is minus, the minus-sided output "−OUT" becomes such a signal produced by modulating the minus value (differential value) of the analog input signal in the pulse width modulation manner, and the plus-sided output "+OUT" continuously becomes a low level.

As a consequence, similar to the class-D amplifier of the embodiment 1, in accordance with the class-D amplifier of the embodiment 3, the analog input signal can be converted into the PWM signals having the three values which are constructed of any of the zero volt value, the plus value, and the minus value, and then, these converted PWN signals can be output. In accordance with the class-D amplifier of the embodiment 3, in the case that the value of the analog input signal becomes higher than, or equal to a predetermined value, the output signal thereof becomes such a switching waveform of only one-sided signal of any one of the plus-sided output "+OUT" and the minus-sided output "−OUT" as represented in FIG. 10 and FIG. 11. As a consequence, according to the class-D amplifier of this embodiment 3, the switching loss thereof can be made about half of the switching loss of the conventional class-D amplifier which is switched on both the plus side and the minus side.

In accordance with the class-D amplifier of the embodiment 3, since the analog feedback is realized by employing the resistors R3 and R4, the class-D amplifier can amplify the analog input signals under better linear condition, while such a digital process operation as described in the above-explained patent publication 2 is not carried out. In accordance with the class-D amplifier of the embodiment 3, different from the amplifier described in the above-explained patent publication 1, while a transformer used in an impedance conversion and used to cut off a DC voltage is no longer required, such a class-D amplifier having low power loss and low distortion can be provided, the DC output component of which is made nearly equal to zero volt.

Moreover, in accordance with the class-D amplifier of this embodiment 3, while the delay circuits 21, 22, and 81 are not employed as the structural elements, since the resistance values of the resistors R5 to R12 are adjusted, the time differences (phase differences) can be made between the first synthesized wave "e" and the second synthesized wave "f", and between the third synthesized wave "g" and the fourth synthesized wave "h", which is different from the above-described class-D amplifiers of the embodiments 1 and 2. As a consequence, the class-D amplifier of this embodiment 3 can be designed and manufactured in a simple manner, and further, the class-D amplifier having high performance can be provided.

Embodiment 4

Figure 12:
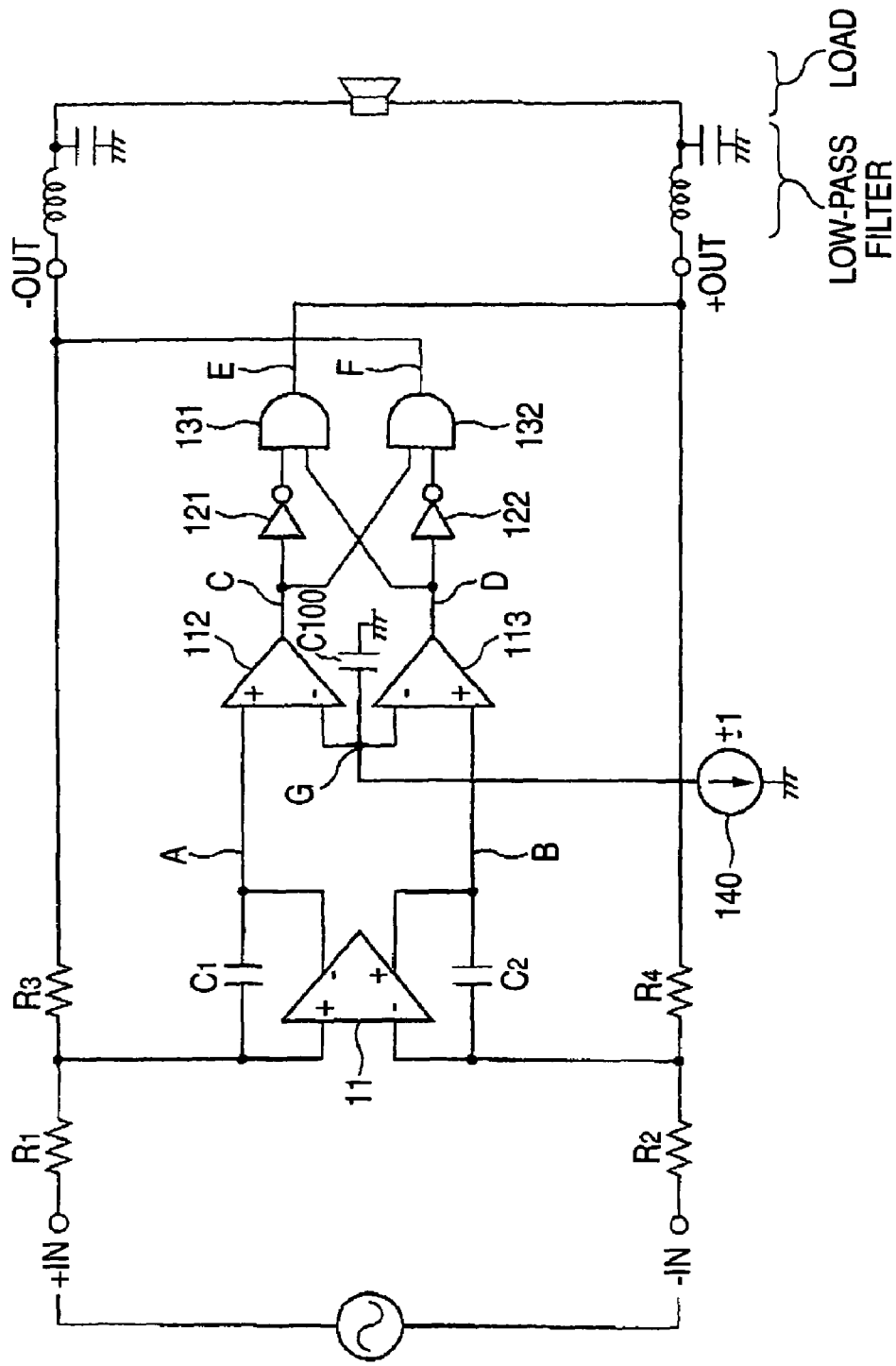
FIG. 12 is a circuit diagram for representing a structural example of a class-D amplifier according to an embodiment 4 of the present invention.

Next, the embodiment 4 according to the present invention will be described with reference to FIGS. 12 to 17. FIG. 12 is a circuit diagram showing a configuration of class-D amplifier according to the embodiment 4 of the invention. Same reference numerals are applied to common elements used in the class-D amplifier according to the embodiment 1. The present class-D amplifier according to the embodiment 4 is difference from the class-D amplifier according to the embodiments 1 and 2 in that a single triangular wave generating circuit is provided. The present class-D amplifier will be described in detail hereinafter.

The class-D amplifier includes resistors R1, R2, R3 and R4, condensers C1, C2 and C100, an operational amplifier 11, a comparators 112 and 113, inverters 121 and 122, AND circuits 131 and 132 and a current source 140. The condenser 100 and the current source constitute the triangular wave generating circuit that outputs a triangular wave to a minus input side of the comparators 112 and 113.

One end of each resistors R1 and R2 are a differential input end for analog input signal. One end of the resistor R1 is a plus-sided input terminal (+IN) and one end of the resistor R2 is a minus-sided input terminal (−IN). Operational amplifier 11 and the condensers C1 and C2 constitute an integrator. The analog input signal that is differentially input to the resistors R1 and R2 is integrated by the integrator to output to the comparators 112 and 113.

The minus-sided output of the operational amplifier 11 is connected to the plus-sided input terminal of the comparator 112 (first comparator). The plus-sided output of the operational amplifier 11 is connected to the plus-sided input terminal of the comparator 113 (second comparator). The minus-sided input terminals of the comparators 112 and 113 are respectively connected to one end of the condenser 100 (capacitor)/The other end of the condenser 100 is connected to the ground, and the other end of the current source is connected to the ground. With this arrangement, the comparator 112 compares the minus-sided output of the operational amplifier 11 with the output of the triangular wave generating circuit and output the comparison result. The comparator 113 compares the plus-sided output of the operational amplifier 11 with the output of the triangular wave generating circuit and output the comparison result.

The output of the comparator 112 is connected to an input terminal of the inverter 121 and one of input terminals of the AND circuit 132 (second buffer). The output of the comparator 113 is connected to an imput terminal of the inverter 122 and one of input terminals of the AND circuit (first buffer) The output of the inverter 121 is connected to the other input terminal of the AND circuit 131. The output of the inverter 122 is connected to the other input terminal of the AND circuit 132. With the arrangement, the AND circuit 131 calculates the logical product of the signal inverted from the output of the comparator 112 and the output of the comparator 113, and output the calculated result. The AND circuit 132 calculates the logical product of the signal inverted from the output of the converter 113 and the output of the comparator 112, and outputs the calculated result.

The output of the AND circuit 131 is a plus-sided output +OUT of the class-D amplifier. The plus-sided output +OUT is fed buck to the minus-sided input of the operational amplifier through the resister R4. The output of the AND circuit 132 is a minus-sided output −OUT of the class-D amplifier. The minus-sided output −OUT is fed back to the plus-sided input of the operational amplifier through the resistor R3.

Figure 13:
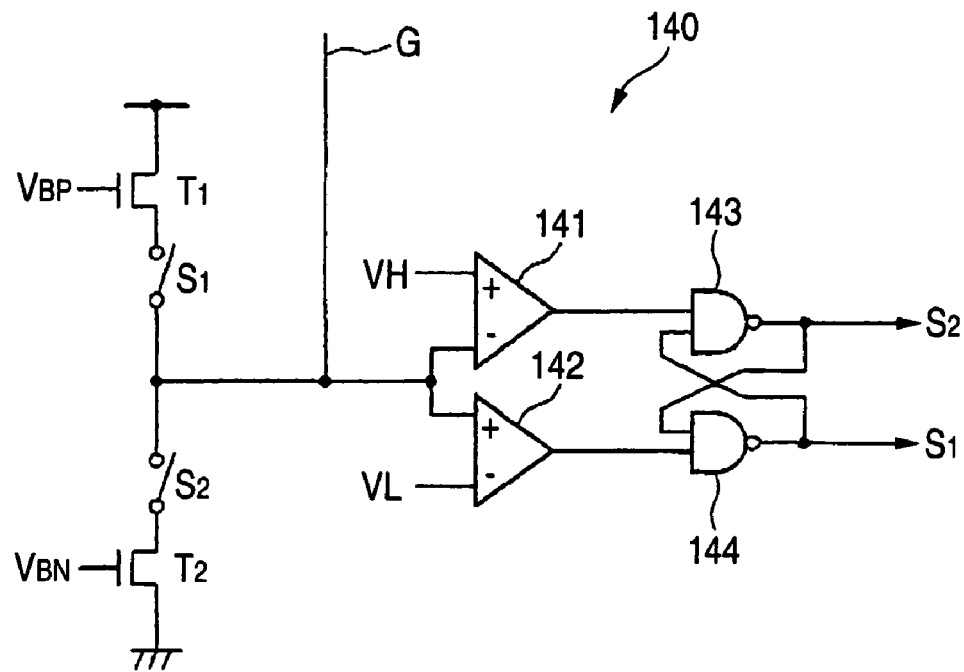
FIG. 13 is a circuit diagram for representing a structural example of a current source of the class-D amplifier.

FIG. 13 is a circuit diagram showing a specific configuration of the current source 140. The current source 140 and the condenser 100 constitute the triangular wave generating circuit. The current source 140 is constituted by transistors T1 and T2, switches S1 and S2, comparators 141 and 142, and NAND circuits 143 and 144.

The transistors T1 and T2 are constituted by a field-effect transistor (FET). A voltage $V_{BP}$ for controlling a charge current value of the condenser 100 is applied to a gate of the transistor T1. A voltage $V_{BN}$ for controlling a discharge current value of the condenser is applied to a gate of the transistor T2. The switches S1 and S2 comprises analog switches, and can be constituted by FET. The switches S1 and S2 switch the flowing direction of the current output from the current source 140, that is, switch charge and discharge of the condenser 100. The current input/output terminals of the transistor T1, the switches S1 and S2 and the current input/output terminals of the transistor T2 are connected each other in series as shown in FIG. 13. The minus-sided input terminal of the comparator 141 and the plus-sided input terminal of the comparator 142 are connected to a connection point of the switches S1 and S2. The connection point is also connected to the condenser 100 and constitutes the output terminal of the triangular wave generating circuit.

The comparator 142 compares a desired first electric potential VL with the electric potential of the connecting point, and outputs the comparison result. The comparator 141 compares a desired second electric potential VH with the electric potential of the connecting point, and outputs the comparison result. Assuming that the second electric potential VH is higher than the first electric potential VL. The difference between the second electric potential VH and the first electric potential VL sets amplitude of the triangular wave. NAND circuits 143 and 144 are connected so as to constitute a flip-flop circuit. The flip-flop circuit has inputs that are outputs of the comparators 141 and 142. The output of the flip-flop circuit controls opening/closing of the switches S1 and S2. That is, the output of the flip-flop circuit switches the charge and discharge of the condenser 100 to switch rise and fall of the triangular wave.

Figure 14:
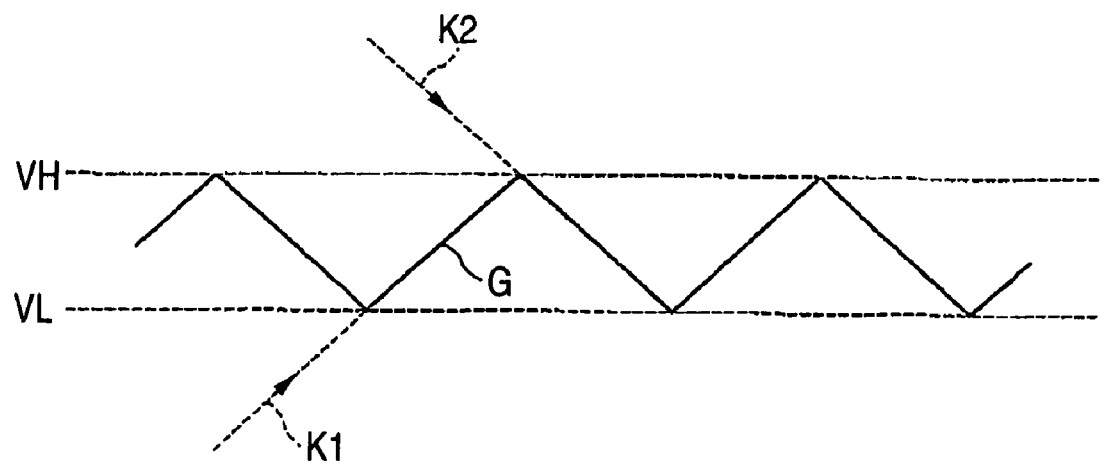
FIG. 14 is a waveform diagram showing operations of the current source.

FIG. 14 is a diagram for explaining an operation of the current source 140.

First, the operation in the case the triangular wave G that is the electric potential of the connecting point is lower the first electric potential VL, that is in the case of a dot line K1 will be described. In the case of the dot line K1, the output of the comparator 142 becomes low, and causes the switch S1 to turn on and the switch S2 to turn off. Thereby, the charge current flows through the transistor T1 and the switch S1 into the condenser 100. Therefore, the triangular wave G that is the electric potential of the condenser 100 rises.

When the triangular wave F exceeds the first electric potential VL and reaches the second electric potential VH, the output of the comparator 141 becomes low and causes the switch S2 to turn on and the switch S2 to turn off. Thereby, the discharge current of the condenser 100 flows through the transistor T2 and the switch S2 to the ground. Therefore, the triangular wave G falls.

When the triangular wave G reaches the first electric potential VL, the output of the comparator 142 becomes low and causes the switch S1 to turn on and the switch S2 to turn off. Thereby, the charge current flows again and the triangular wave G rises. By repeating these operations after this, the triangular wave G as shown in FIG. 14 is generated. An inclination of the triangular wave G at the time of falling can be set by the voltage $V_{BN}$ for controlling the discharge current and the capacitance of the condenser 100.

Next, the operation in the case the triangular wave G is higher than the second electric potential VH, that is, the case of a dot line K2, will be described. In the case of the dot line K2. the output of the comparator 141 becomes low and causes the switch S2 to turn on and the switch S1 to turn off. Thereby, the discharge current of the condenser 100 flows through the transistor T2 and the switch S2. Therefore, the triangular wave G that is the electric potential of the condenser 100 falls. Thereafter, as described above, the charge and discharge of the condenser 100 repeat and the triangular wave G as shown in FIG. 14 is generated.

Accordingly, with the class-D amplifier of the present embodiment, the triangular wave generating circuit having simple structure constituted by the condenser 100 and the current source 140 can be provided. Therefore, efficiency is high and low distortion class-D amplifier can be provided with low cost.

Next, the operation of the class-D amplifier according to the embodiment 4 will be described with reference to the FIGS. 15 to 17. The FIGS. 15 to 17 are waveform diagrams showing the operation at each parts of the class-D amplifier as shown in FIG. 12.

Figure 15:
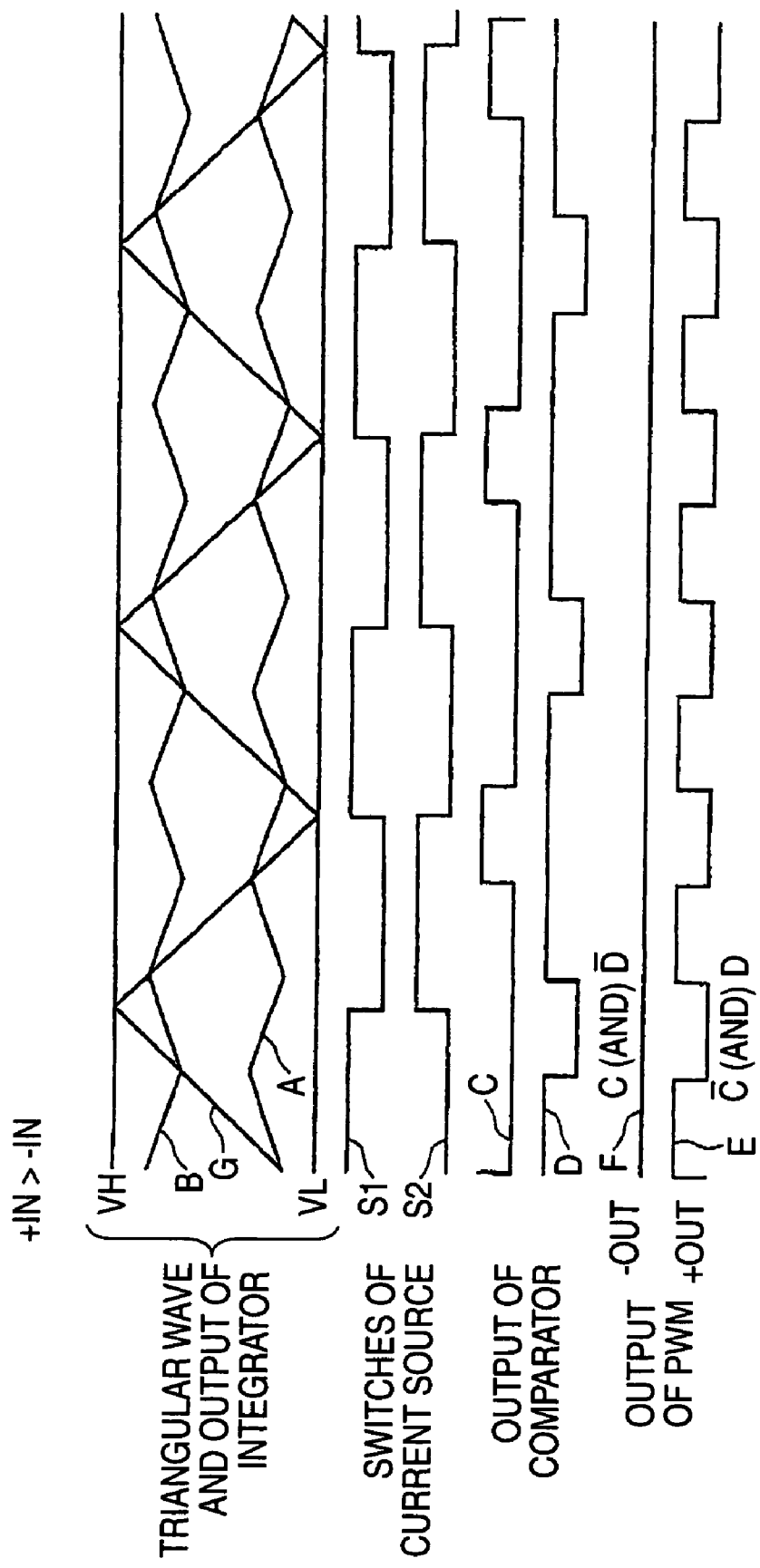
FIG. 15 is a waveform diagram showing operations in the case that a plus value is applied to the class-D amplifier.
Figure 16:
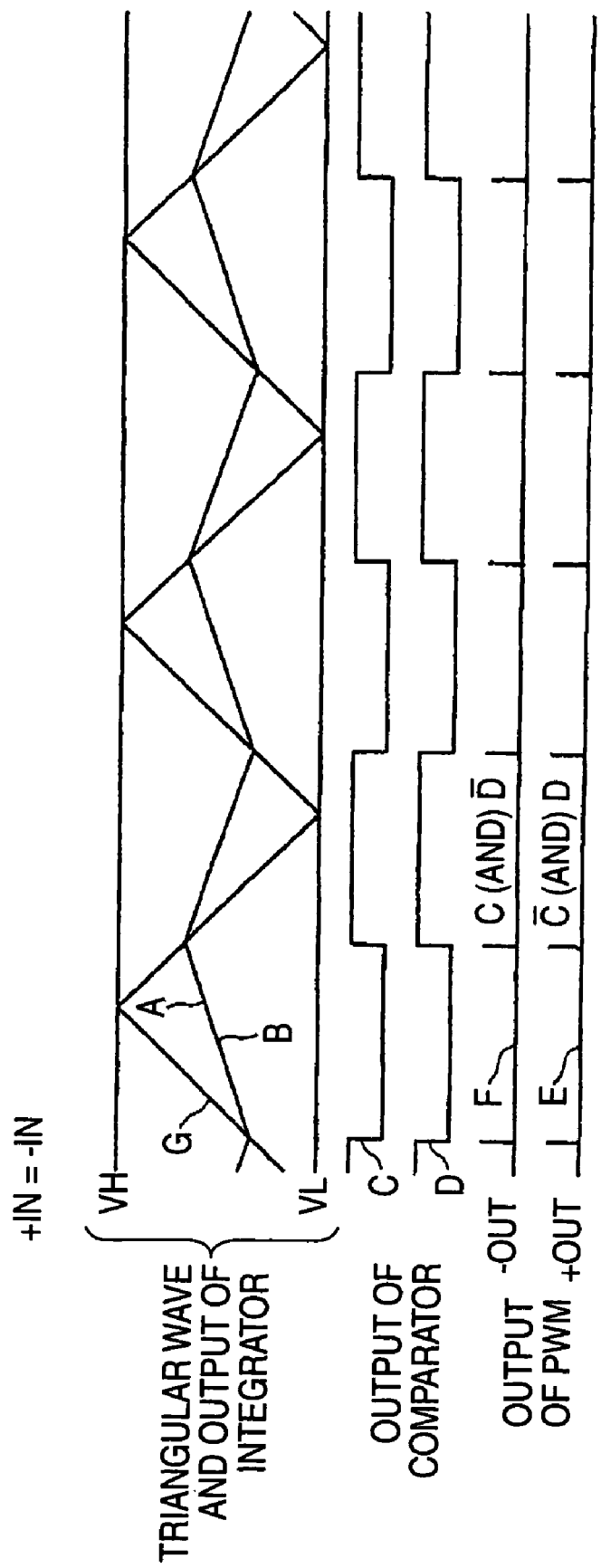
FIG. 16 is a waveform diagram showing operations in the case that 0 volt is applied to the class-D amplifier.

FIG. 15 shows waveforms of each parts of the class-D amplifier at the time of (analog input signal +IN)>(analog input signal −IN), that is, at the time in which the differential input is plus. The triangular wave G is a triangular wave in which the first electric potential VL is minimum and the second electric potential VH is maximum.

The minus-sided output A of the integrator is low level compared with the plus-sided output B of the integrator since the differential input of the integrator is plus. FIG. 15 shows a drive waveform of the switches S1 and S2 of the current source 140. The switch S1 of the current source 140 is turned on at a rising section of the triangular wave G in response to the high level signal. The switch S1 is turned off at a falling section of the triangular wave G in response to the low level signal. The switch S2 of the current source 140 is turned off at a rising section of the triangular wave G in response to the low level signal. The switch S2 is turned on at the falling section of the triangular wave G in response to the high level signal.

The output C of the comparator 112 becomes high when the comparison result of the minus-sided output A of the integrator with the triangular wave G is A>G, and becomes low when the comparison result is A<G. The output D of the comparator 113 becomes high when the comparison result of the plus-sided output B of the integrator with the triangular wave G is B>G, and becomes low when the comparison result becomes B<G.

The output (+OUT) E of the AND circuit 131 becomes high when both the value inverted from the output C of the comparator 112 and the output D of the comparator 113 are high. Thereby, duty ratio at the period when the plus-sided output +OUT is high level is substantially in proportion to amplitude of the plus value (differential value) of the analog input signal. In other words, the plus-sided output +OUT is a pulse-width modulated signal of the plus value (differential value) of the analog input signal.

On the other hand, the output (−OUT) F of the AND circuit 132 becomes high when both the output of the comparator 112 and the value inverted from the output D of the comparator 113 are high. Here, the minus-sided output −OUT is always low level.

FIG. 16 shows waveforms of each parts of the class-D amplifier at the time of (analog input signal +IN)=(analog input signal −IN), that is, at the time that differential input is zero (0 volt input). The triangular wave G shown in FIG. 16 is identical to the triangular wave G shown in FIG. 15. Since the operation of the switches S1 and S2 of the current source 140 with respect to the triangular wave F is identical to the operation shown in FIG. 15, the drive signals of the switches S1 and S2 are omitted from FIG. 16.

The minus-sided output A of the integrator and the plus-sided output B of the integrator have same level since the differential input of the integrator is (+IN)=(−IN). The output C of the comparator 112 and the output D of the comparator 113 have same waveform as well as same phase since the output A equal to the output B.

Since the output (+OUT) E of the AND circuit 131 is (inverted value of output C)*(output D), the output E is low level over most of whole period. Since the output (−OUT) F is (output C)*(inverted value of output D), the output F is low lever over most of whole period. As shown in FIG. 16, there is a few high level period at the plus-sided output +OUT and the minus-sided output −OUT due to differences of the delay time owing to nonidentity of the offset voltage of the operational amplifier 121, and the elements constituting comparators 112 and 114 and the inverters and 121 and 122. Therefore, the plus-sided output +OUT and the minus-sided output −OUTPUT can be simply assumed to be strictly low level over the whole period.

As described above, according to the class-D amplifier of the embodiment 4, since the period during the output signal is high level can be extremely shorten easily when no analog input signal is applied (in the case of 0 volt value input), power loss can be dramatically decreased as compared with the conventional apparatus with the simple structure.

FIG. 17 shows waveforms of the each parts of the class-D amplifier at the time of (analog input signal +IN)<(analog input signal −IN), that is, the differential input is minus. The triangular wave F is identical to the triangular wave G shown in FIG. 15. Since the operations of the switches S1 and S2 of the current source 140 with respect to the triangular wave G is identical to the operation shown in FIG. 15, the drive waveforms of the switches S1 and S2 are omitted from FIG. 17.

The minus-sided output A of the integrator is high level than the plus-sided output B of the integrator. The output C of the comparator 112 becomes high when the comparison result of the minus-sided output A of the integrator with the triangular wave G is A>G, and becomes low when the comparison result is A<G. The output ED of the comparator 113 becomes high when the plus-sided output B of the integrator with the triangular wave G is B>G and becomes low when the comparison result is B<G.

The output (−OUT) F of the AND circuit 132 becomes high when both the output C of the comparator 112 and the inverted value of the output D of the comparator 113 are high. Thereby, the duty ratio at the period during the minus-sided output −OUT is high level is substantially in proportion to the amplitude of the minus value (differential value) of the analog input signal. In other words, the minus-sided output −OUT is a pulse-width modulated signal of the minus value (differential value) of the analog input signal.

On the other hand, the output (+OUT) E of the AND circuit 131 is high when both the inverted value of the output C of the comparator 112 and the output D of the comparator 113 are high. Here, the plus-sided output +OUT is always low.

As described above, according to the class-D amplifier of the embodiment 4, the analog input signal can be output by converting it into 3-values PWM signal consisting of 0 volt value, plus value and minus value. According to the class-D amplifier of the embodiment 4, when the analog input signal becomes a value except 0 volt value, the switching waveform is only appeared on one of the plus-sided output +OUT and the minus-sided output −OUT as shown in FIGS. 15 and 17.

According to the class-D amplifier of the embodiment 4, since the resistors R3 and R4 constitute the analog feedback circuits, the analog input signal can be amplified with good linearity without performing digital processing as described in Japanese Patent Disclosure No. 2000-500625. Further, according to the class-D amplifier according to the embodiment 4, direct output component can be substantially eliminated without providing a transformer for impedance conversion and a direct voltage cut which is described in Japanese Patent Publication No. Sho-56-27001, for example. Therefore, low distortion, high power efficiency class-D amplifier can be provided.

While the embodiment modes of the present invention have been described in detail with reference to the drawings, the concrete structure thereof is not limited only to this embodiment mode, but may apparently cover structures defined within the range without departing from the technical spirit of the present invention.

For example, although, in the class-D amplifier of the above described embodiments, the integrator is constituted by a primary integrator, the present invention is not limited thereto and the integrator may be constituted by high-order integrator. By constituting like this, the loop gain can be increased and the distortion rate can be further reduced.

In the above-explained description, the present invention has been described as the class-D amplifiers, but the present invention is not limited only thereto. Accordingly, the present invention may be applied to signal processing circuits other than the class-D amplifiers, and various sorts of pulse width modulation amplifier.

TRANSLATION OF DRAWINGS

FIG. 1
1 low-pass filter;
2 load;

FIG. 2 to FIG. 4
1 triangular wave;
2 output of integrator;
3 input of comparator;
4 output of comparator;
5 PWM output;

FIG. 5
1 low-pass filter;
2 load;
81 delay circuit;

FIG. 6
1 triangular wave;
2 output of integrator;
3 output of comparator;
5 PWM output;
6 output of feedback amplifier;

FIG. 7
1 low-pass filter;
2 load;
3 voltage;
4 time;

FIG. 8
1 low-pass filter;
2 load;

FIG. 9 to FIG. 11
1 triangular wave;
2 output of integrator;
3 input of comparator;
4 output of comparator;
5 PWM output;

What is claimed is:

1. A class-D amplifier comprising:
    an integrator that integrates an analog input signal;
    a first comparator that compares an output of the integrator with a first triangular wave;
    a second comparator that compares the output of the integrator with a second triangular wave, the second triangular wave being equal to a waveform obtained by shifting a phase of the first triangular wave by an angle of 180 degrees plus or minus a very small angle;
    a buffer circuit that outputs a plus-sided output signal and a minus-sided output signal based on an output of the first comparator and an output of the second comparator; and a feedback circuit that feeds back a difference between the plus-sided output signal and the minus-sided output signal to an input side of the integrator.

2. The class-D amplifier according to claim 1, wherein the buffer circuit includes:
a first buffer circuit that calculates a logical product of the output of the first comparator and the output of the second comparator to output a calculated result as the minus-sided output signal; and
a second buffer circuit that calculates a logical product of the output of the first comparator and the output of the second comparator to output a calculated result as the plus-sided output signal.

3. The class-D amplifier according to claim 1, wherein the feedback circuit includes a differential amplifier for amplifying a difference between the plus-sided output signal and the minus-sided output signal.

4. A class-D amplifier comprising:
an integrator that integrates a difference between a plus-sided input signal and a minus-sided input signal, which constitute an analog input signal;
a delay circuit that delays a phase of a triangular wave by a predetermined very small angle;
a synthesizing circuit that synthesizes an output of the integrator, the triangular wave, and an output of the delay circuit with each other so as to output a plurality of output signals;
a comparator that compares the plurality of output signals of the synthesizing circuit with each other;
a buffer circuit that inputs an output of the comparator; and
a feedback circuit that feeds back an output of the buffer circuit to an input side of the integrator.

5. The class-D amplifier according to claim 4, wherein
the triangular wave is constituted by a first triangular wave and a second triangular wave corresponding to a waveform produced by shifting a phase of the first triangular wave by an angle of 180 degrees,
the delay circuit includes a first delay circuit for delaying the phase of the first triangular wave by the predetermined very small angle, and a second delay circuit for delaying a phase of the second triangular wave by the predetermined very small angle,
the synthesizing circuit synthesizes the minus-sided output of the integrator with the first triangular wave to produce a first synthesized wave, synthesizes the pulse-sided output of the integrator with the second triangular wave to produce a second synthesized wave, synthesizes the minus-sided output of the integrator with an output of the second delay circuit to produce a third synthesized wave, and synthesizes the plus-sided output of the integrator with an output of the first delay circuit to produce a fourth synthesized wave,
the comparator includes a first comparator for comparing the first synthesized wave with the second synthesized wave, and a second comparator for comparing the third synthesized wave with the fourth synthesized wave,
the buffer circuit includes a first buffer circuit for calculating a logical product of an output of the first comparator and an output of the second comparator, and a second buffer circuit for calculating a logical product of the output of the first comparator and the output of the second comparator, and
the feedback circuit includes a first feedback circuit for feeding back the output of the first buffer circuit to the plus-sided input of the integrator, and a second feedback circuit for feeding back the output of the second buffer circuit to the minus-sided input of the integrator.

6. A class-D amplifier comprising:
an integrator that integrates a difference between a plus-sided input signal and a minus-sided input signal, which constitute an analog input signal;
a synthesizing circuit that synthesizes an output of the integrator with a first triangular wave, and synthesizes the output of the integrator with a second triangular wave having an opposite phase to that of the first triangular wave so as to output a plurality of signals, wherein the second triangular wave corresponds to a waveform whose phase is shifted by 180 degrees with respect to the phase of the first triangular wave;
a comparator that compares output signals of the synthesizing circuit with each other;
a buffer circuit that inputs thereinto an output of the comparator; and
a feedback circuit that feeds back an output of the buffer circuit to an input side of the integrator,
wherein the synthesizing circuit includes a plurality of resistors having at least two resistance values, and is arranged so that a phase difference is produced between the plurality of signals corresponding to the output of the synthesizing circuit based upon the resistance values of the plurality of resistors and an input capacitance of the comparator.

7. The class-D amplifier according to claim 6, wherein the synthesizing circuit includes: a first synthesizing portion for synthesizing a minus-sided output of the integrator with the first triangular wave to produce a first synthesized wave; a second synthesizing portion for synthesizing a plus-sided output of the integrator with the second triangular wave to produce a second synthesized wave; a third synthesizing portion for synthesizing the minus-sided output of the integrator with the second triangular wave to produce a third synthesized wave; and a fourth synthesizing portion for synthesizing the plus-sided output of the integrator with the first triangular wave to produce a fourth synthesized wave;
the first synthesizing portion includes a first resistor whose one terminal is connected to the minus-sided output of the integrator, and a second resistor in which the first triangular wave is applied to one terminal thereof; and an other terminal of the first resistor is connected to an other terminal of the second resistor so as to constitute an output terminal thereof;
the second synthesizing portion includes a third resistor whose one terminal is connected to the plus-sided output of the integrator, and a fourth resistor in which the second triangular wave is applied to one terminal thereof; and an other terminal of the third resistor is connected to an other terminal of the fourth resistor so as to constitute an output terminal thereof;
the third synthesizing portion includes a fifth resistor whose one terminal is connected to the minus-sided output of the integrator, and a sixth resistor in which the second triangular wave is applied to one terminal thereof; and an other terminal of the fifth resistor is connected to an other terminal of the sixth resistor so as to constitute an output terminal thereof;
the fourth synthesizing portion includes a seventh resistor whose one terminal is connected to the plus-sided output of the integrator, and an eighth resistor in which the first triangular wave is applied to one terminal thereof; and an other terminal of the seventh resistor is connected to an other terminal of the eighth resistor so as to constitute an output terminal thereof;

the comparator includes a first comparator having one input terminal to which the output terminal of the first synthesizing portion is connected, and an other input terminal to which the output terminal of the second synthesizing portion is connected; and a second comparator having one input terminal to which the output terminal of the third synthesizing portion is connected, and an other input terminal to which the output terminal of the fourth synthesizing portion is connected;

the buffer circuit includes a first buffer circuit to calculate a logical product of an output of the first comparator and an output of the second comparator, and a second buffer circuit for calculating a logical product of the output of the first comparator and the output of the second comparator;

the feedback circuit includes a first feedback circuit for feeding back the output of the first buffer circuit to the plus-sided input of the integrator, and a second feedback circuit for feeding back the output of the second buffer circuit to the minus-sided input of the integrator; and a resistance value of any one of the first resistor, the second resistor, the third resistor, and the fourth resistor is different from a resistance value of any one of the fifth resistor, the sixth resistor, the seventh resistor, and the eighth resistor.

8. The class-D amplifier according to claim 7 wherein the resistance value of each of the first resistor, the second resistor, the third resistor, and the fourth resistor is a resistance value obtained by multiplying a value other than 1 with respect to the resistance value of each of the fifth resistor, the sixth resistor, the seventh resistor, and the eighth resistor.

9. A class-D amplifier comprising:

an integrator that integrates a difference between a plus-sided input signal and a minus-sided input signal, which constitute an analog input signal;

a triangular wave generating circuit that includes a current source and a capacity capacitor;

a comparator that compares an output of the integrator with an output of the triangular wave generating circuit;

a buffer circuit that inputs an output of the comparator; and a feedback circuit that feeds back an output of the buffer circuit to an input side of the integrator, wherein one end of the capacitor is connected to one of the input terminals of the comparator;

the current source switches a direction of output current so as to repeat charge and discharge of the capacitor, one end of the current source is connected to the one end of the capacitor, the current source flows current in a direction in which the capacitor is charged when an electric potential of the capacitor is lower than a first electric potential and flows current in a direction in which the capacitor is discharged when the electric potential of the capacitor is higher than a second electric potential, and the second electric potential is higher than the first electric potential.

10. The class-D amplifier according to claim 9, wherein the comparator includes a first comparator for comparing a minus-sided output of the integrator with the output of the triangular wave generating circuit, and a second comparator for comparing a plus-sided output of the integrator with the output of the triangular wave generating circuit, the buffer circuit includes a first buffer circuit for calculating a logical product of an inverted value of an output of the first comparator and an output of the second comparator, and a second buffer circuit for calculating a logical product of the first comparator and an inverted value of the second comparator, and the feedback circuit includes a first feedback circuit for feeding back an output of the first buffer circuit to the minus-sided input of the integrator, and a second feedback circuit for feeding back an output of the second buffer circuit to the plus-sided input of the integrator.

* * * * *